United States Patent
Ito

(10) Patent No.: US 8,648,358 B2
(45) Date of Patent: Feb. 11, 2014

(54) LIGHT EMITTING DEVICE, PLANAR LIGHT SOURCE, AND DISPLAY DEVICE

(75) Inventor: Shin Ito, Osaka (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 378 days.

(21) Appl. No.: 13/201,274

(22) PCT Filed: Feb. 18, 2010

(86) PCT No.: PCT/JP2010/001053
§ 371 (c)(1),
(2), (4) Date: Aug. 12, 2011

(87) PCT Pub. No.: WO2010/095441
PCT Pub. Date: Aug. 26, 2010

(65) Prior Publication Data
US 2011/0291131 A1 Dec. 1, 2011

(30) Foreign Application Priority Data
Feb. 19, 2009 (JP) ................................ 2009-036848

(51) Int. Cl.
*H01L 33/00* (2010.01)
(52) U.S. Cl.
USPC ............... 257/88; 257/98; 257/99; 257/100; 257/E33.058; 257/E33.059; 257/E25.019
(58) Field of Classification Search
None
See application file for complete search history.

(56) References Cited

U.S. PATENT DOCUMENTS

| | | | |
|---|---|---|---|
| 6,598,998 B2 | 7/2003 | West et al. | |
| 7,385,653 B2 * | 6/2008 | Kim et al. | 349/61 |
| 7,560,745 B2 * | 7/2009 | Kim et al. | 257/98 |
| 8,011,802 B2 * | 9/2011 | Hoshi | 362/244 |
| 2002/0163810 A1 | 11/2002 | West et al. | |
| 2005/0243577 A1 | 11/2005 | Moon | |
| 2005/0264716 A1 | 12/2005 | Kim et al. | |
| 2006/0119250 A1 | 6/2006 | Suehiro | |
| 2007/0109779 A1 | 5/2007 | Sekiguchi et al. | |
| 2007/0126948 A1 | 6/2007 | Kim et al. | |
| 2008/0007966 A1 | 1/2008 | Ohkawa | |
| 2010/0165246 A1 | 7/2010 | Sekiguchi et al. | |
| 2010/0172134 A1 | 7/2010 | Moon | |
| 2010/0295466 A1 | 11/2010 | Katakame | |
| 2011/0267559 A1 | 11/2011 | Sekiguchi et al. | |

FOREIGN PATENT DOCUMENTS

| | | |
|---|---|---|
| JP | 2002-344027 | 11/2002 |
| JP | 2003-008081 | 1/2003 |
| JP | 2003-218408 | 7/2003 |

(Continued)

OTHER PUBLICATIONS

International Search Resort for PCT/JP2010/001053, mailed Apr. 6, 2010.

*Primary Examiner* — Alonzo Chambliss
(74) *Attorney, Agent, or Firm* — Nixon & Vanderhye, P.C.

(57) ABSTRACT

A mortar-shaped or funnel-shaped light emitting device (50) includes: a substrate (20); at least one LED chip (25) die-bonded to the substrate (20); and a wavelength converting portion (40) covering said at least one LED chip (25); at least four planes uprising from the substrate (20); and a lens having a top surface (10*a*) facing the substrate (20), the four planes being positioned in four directions, respectively, in such a manner as to surround said at least one LED chip (25), and the top surface (10*a*) having a concave portion.

19 Claims, 22 Drawing Sheets

(56) References Cited

FOREIGN PATENT DOCUMENTS

| | | |
|---|---|---|
| JP | 2004-140327 | 5/2004 |
| JP | 2005-190859 | 7/2005 |
| JP | 3715635 | 9/2005 |
| JP | 2005-317977 | 11/2005 |
| JP | 2005-340750 | 12/2005 |
| JP | 2005-353875 | 12/2005 |
| JP | 2007-157686 A | 6/2007 |
| JP | 2007-227410 | 9/2007 |
| JP | 2008-041843 | 2/2008 |
| WO | WO 2008/047862 | 4/2008 |
| WO | WO 2008/086682 | 7/2008 |

* cited by examiner

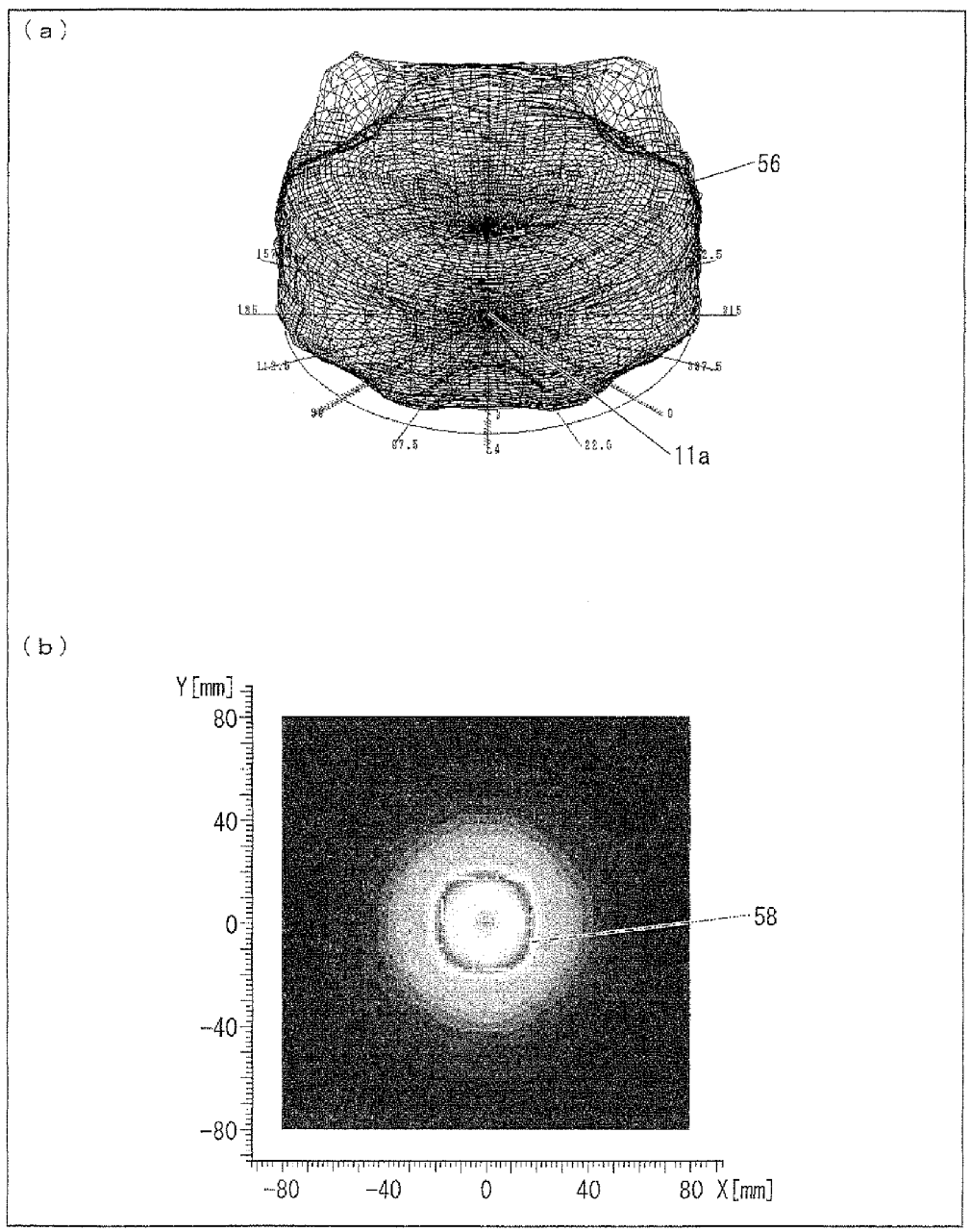

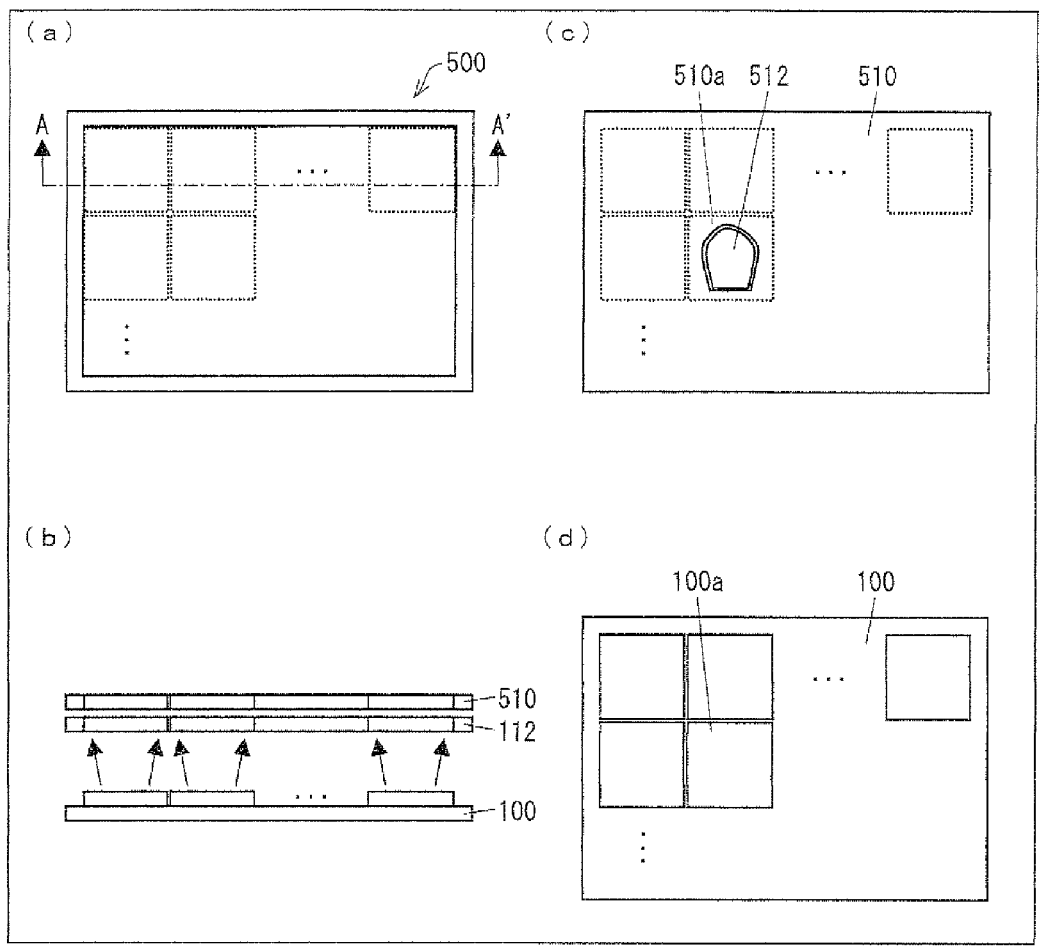

F I G. 2 0
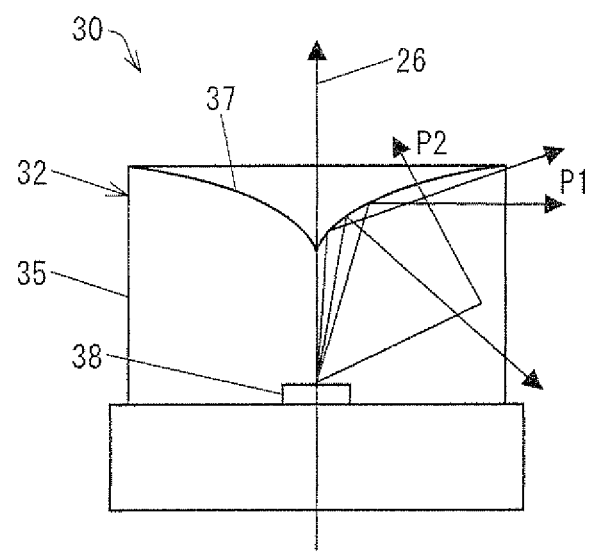

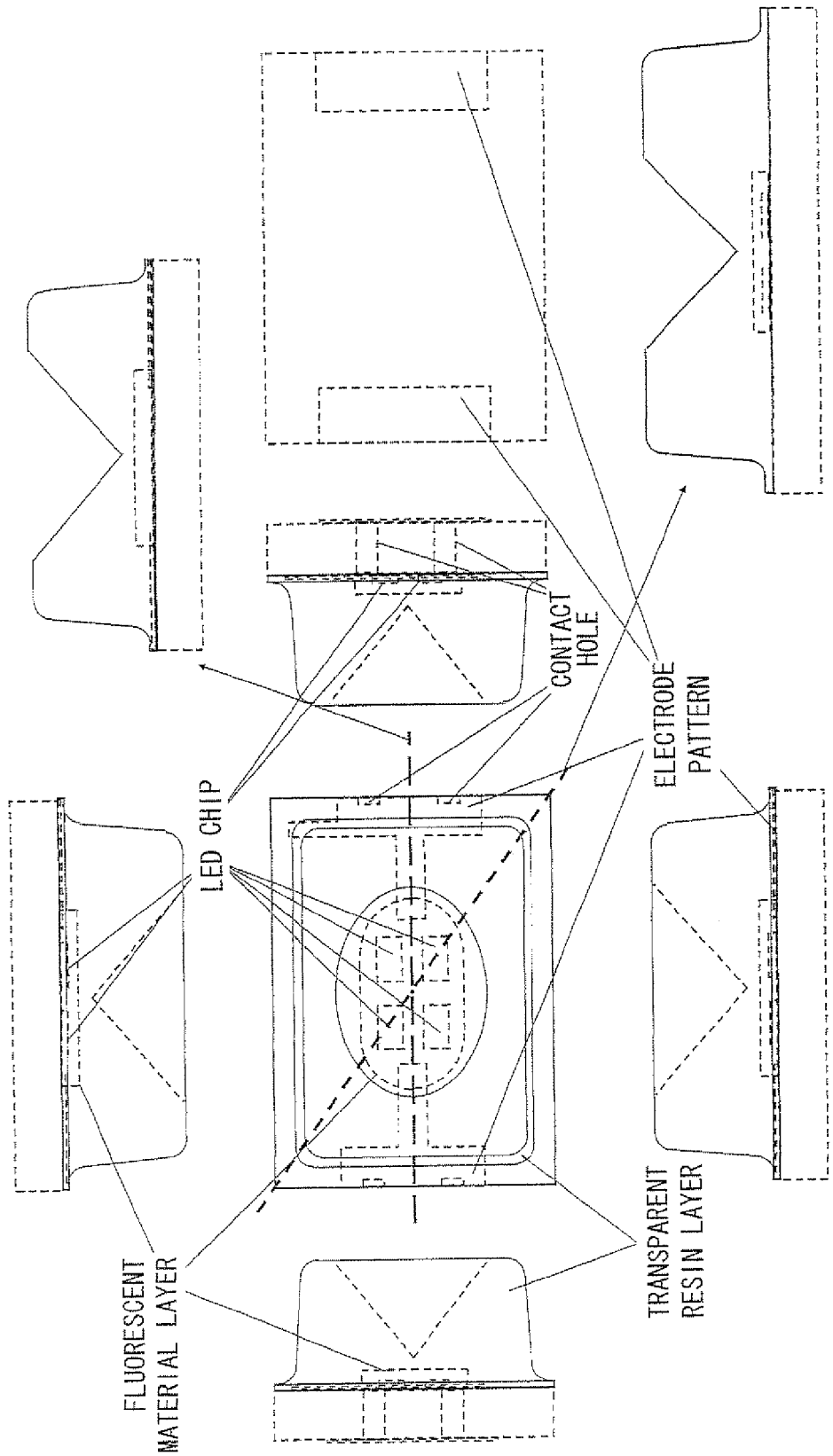
F I G. 21

LIGHT EMITTING DEVICE, PLANAR LIGHT SOURCE, AND DISPLAY DEVICE

This application is the U.S. national phase of International Application No. PCT/JP2010/001053 filed 18 Feb. 2010 which designated the U.S. and claims priority to JP Patent Application No. 2009-36848 filed 19 Feb. 2009, the entire contents of each of which are hereby incorporated by reference.

TECHNICAL FIELD

The present invention relates to: a light emitting device having a sealing material for directing emitted light to a predetermined direction; a planar light source in which a plurality of the light emitting devices are arranged; and a display device including the planar light source.

BACKGROUND ART

Some liquid crystal display devices include, as backlights for illuminating liquid crystal display panels from backsides, planar light sources in which light sources such as LEDs (Light Emitting Diodes) are arranged. Such a backlight is different from an edgelight-type backlight using a light guide plate in that such a backlight illuminates a liquid crystal display panel from the backside without using a light guide plate. Such a backlight is referred to as a direct-type backlight.

Light sources used in the direct-type backlight are required to be reduced in number in order to reduce costs, and therefore a wider light distribution property is required. Some Literatures describe configurations to widen a light distribution property, although the configurations are not directed to backlight sources of liquid crystal display panels.

Patent Literature 1 describes a conventional art example of an LED package 30 including an LED chip 38, a lens 32 with a vertical sidewall 35, and a funnel-shaped upper surface 37 (FIG. 20).

The LED package 30 has two main light paths via which light travel in the LED package 30. Light traveling via a first light path P1 is desirably light emitted from the LED chip 38. This light travels to the upper surface 37 where the light changes its traveling direction at approximately 90 degrees with respect to a vertical axis due to total inner reflection (TIR) so that the light goes out of the LED package 30 via the sidewall 35. Light traveling in a second light path P2 is light emitted from the LED chip 38 toward the sidewall 35 at an angle which causes total inner reflection of the light on the sidewall 35, or light reflected by the sidewall 35 and goes out of the LED package 30 at an angle which is far from being perpendicular to the vertical axis. The light traveling via the second light path P2 is not a desirable one, which limits an efficiency of obtaining light from the sidewall 35.

An object of the LED package 30 is efficiently obtaining light from the sidewall 35, and is not necessarily equal to an object of the present invention which will be explained later. Further, Patent Literature 1 does not detail the lens 32 with the vertical sidewall 35 and the funnel-shaped upper surface 37.

Another Literature describing use of an LED similarly with Patent Literature 1 is Patent Literature 2, which discloses a planar-mounted LED designed to have a wide directivity. Further, Patent Literature 3 discloses a light source, a light guide body, and a planar light emitting device, each of which is applicable to railway signal lamps, traffic signal lamps, large displays, automobile tail lamps etc.

CITATION LIST

Patent Literatures

[Patent Literature 1]
Japanese Patent Application Publication, Tokukai No. 2003-008081 (published on Jan. 10, 2003)
[Patent Literature 2]
Japanese Patent Application Publication, Tokukai No. 2002-344027 (published on Nov. 29, 2002)
[Patent Literature 3]
Japanese Patent No. 3715635 (issued on Sep. 2, 2005)

SUMMARY OF INVENTION

Technical Problem

The above prior art documents explain configurations of sealing resin lenses having wide directivity, but do not describe what light distribution property is required for a light emitting device serving as a light source of a backlight device positioned at the back side of a display panel of a liquid crystal display device, and in particular, what light emission pattern is appropriate at a view plane parallel to a substrate of the light emitting device. The inventor of the present invention has made detailed analysis and found that when a light emitting device is designed such that an illumination shape is substantially rectangular on a plane view parallel to the substrate of the light emitting device, it is possible to provide a thin planar light source with reduced unevenness in illuminance and chromaticity. Further, this configuration makes it very easy to combine a plurality of light emitting devices in fabricating a planer light source, and also makes it very easy to control a liquid crystal display device of an area active (local dimming) type.

However, it has been considered that it is generally very difficult to stably obtain a light emitting device having such a special illumination shape, i.e. a light emitting device having a rectangular illumination shape.

The present invention was made in view of the foregoing problems. An object of the present invention is to provide a display device which suffers little unevenness in illuminance and chromaticity even if the device is made thin, and a light emitting device and a planar light source each of which is suitable for the display device.

Another object of the present invention is to provide, as a light emitting device suitable for such a display device, a light emitting device whose illumination shape is substantially rectangular on a view plane parallel to a substrate of the light emitting device. Still another object of the present invention is to provide a light emitting device structure which enables obtaining such an illumination shape stably.

Still another object of the present invention is to provide a light emitting device having substantially a rectangular illumination shape which shape is suitable for a liquid crystal display of an area active type (local dimming type).

Solution to Problem

In order to solve the foregoing problem, a light emitting device of the present invention includes: a substrate; at least one semiconductor light emitting element die-bonded to the substrate; and a lens covering said at least one semiconductor light emitting element, the lens including four planes uprising from the substrate and a lens having a ceiling surface facing the substrate, the four planes being positioned in four directions, respectively, in such a manner as to surround said at least one semiconductor light emitting element, the ceiling surface having a concave portion, and emission of light from the light emitting device forming, on a view plane parallel to the substrate, a contour of an illumination shape which is a rectangle whose corners are rounded.

With the invention, the light emitting device includes the concave portion at the center of the sealing material, and therefore can form a rectangular illumination shape on a view plane parallel to the substrate. Accordingly, the present invention can provide a light emitting device having a structure suitable for a thin display device with little unevenness in illuminance and chromaticity.

Further, since the light emitting device has a rectangular illumination shape, the light emitting device is preferably applicable to a liquid crystal display device of an area active (local dimming) type.

In order to solve the foregoing problem, a light emitting device of the present invention includes: a substrate; at least one semiconductor light emitting element die-bonded to the substrate; and a lens covering said at least one semiconductor light emitting element, the lens including four planes uprising from the substrate; the four planes being positioned in four directions, respectively, in such a manner as to surround the lens, a ceiling of the lens which faces the substrate being designed such that two wedge-shaped grooves each having an apex facing the substrate extend from one of four lines of intersection of the four planes to diagonally opposite one of the four lines while the two wedge-shaped grooves cross each other, and light from the light emitting device forming, on a view plane parallel to the substrate, a contour of an illumination shape which is a rectangle whose corners are rounded.

With the invention, the light emitting device is designed such that the two wedge-shaped grooves extend from one of four lines of intersection of the four planes to diagonally opposite one of the four lines while the two wedge-shaped grooves cross each other. Consequently, the light emitting device can form a rectangular illumination shape on a view plane parallel to the substrate.

Therefore, it is possible to provide a light emitting device with a structure suitable for a thin display device with little unevenness in illuminance and chromaticity.

Further, a display device of the present invention includes: a planar light source including a mounting substrate and a plurality of light emitting devices on the mounting substrate, an illumination shape of each of the light emitting devices being a rectangle whose corners are rounded; and a display panel capable of changing transmittance of light with respect to each of a plurality of regions, the display panel being illuminated by the planar light source from a backside of the display panel, the planar light source forming, on the display panel, a planar illumination shape derived from overlapping of the illumination shapes of the plurality of light emitting devices. Consequently, it is possible to provide a light emitting device with a structure suitable for a thin display device with little unevenness in illuminance and chromaticity.

Advantageous Effects of Invention

The light emitting device of the present invention includes: a substrate; at least one semiconductor light emitting element die-bonded to the substrate; a sealing material covering said at least one semiconductor light emitting element, four planes uprising from the substrate, and a lens having a ceiling surface facing the substrate, the four planes being positioned in four directions, respectively, in such a manner as to surround said at least one semiconductor light emitting element, the ceiling surface having a concave portion, and emission of light from the light emitting device forming, on a view plane parallel to the substrate, a contour of an illumination shape which is a rectangle whose corners are rounded.

The light emitting device of the present invention includes: a substrate; at least one semiconductor light emitting element die-bonded to the substrate; and a sealing material covering said at least one semiconductor light emitting element, the sealing material serving as a lens including four planes uprising from the substrate and a ceiling surface facing the substrate; the ceiling surface having a concave portion, and emission of light from the light emitting device forming, on a view plane parallel to the substrate, a contour of an illumination shape which is a rectangle whose corners are rounded.

Therefore, it is possible to provide a thin light emitting device with little unevenness in illuminance and chromaticity.

BRIEF DESCRIPTION OF DRAWINGS

FIG. 18 shows drawings of an illumination shape of a light emitting device in accordance with still another embodiment of the present invention. (a) of FIG. 18 is a simulation view three-dimensionally showing a light distribution property of the light emitting device in accordance with still another embodiment. (b) of FIG. 18 is a simulation view showing the illumination shape of the light emitting device in accordance with still another embodiment.

FIG. 19 schematically shows a liquid crystal display device based on an area active (local dimming) method. (a) of FIG. 19 is a plan view of the liquid crystal display device based on an area active (local dimming) method. (b) of FIG. 19 is a transverse sectional view of the liquid crystal display device based on an area active (local dimming) method taken along an A-A' line of (a) of FIG. 19. (c) and (d) of FIG. 19 are views showing a positional relationship between divided regions of a display panel and divided regions of a planar light source.

FIG. 20 is an elevation view of a conventional LED package.

FIG. 21 shows top views and side views of a light emitting device in accordance with Additional Example 1.

DESCRIPTION OF EMBODIMENTS

Embodiment 1

The following explains an embodiment of the present invention with reference to FIGS. 1-10.
[Light Emitting Device]

Figure 1:
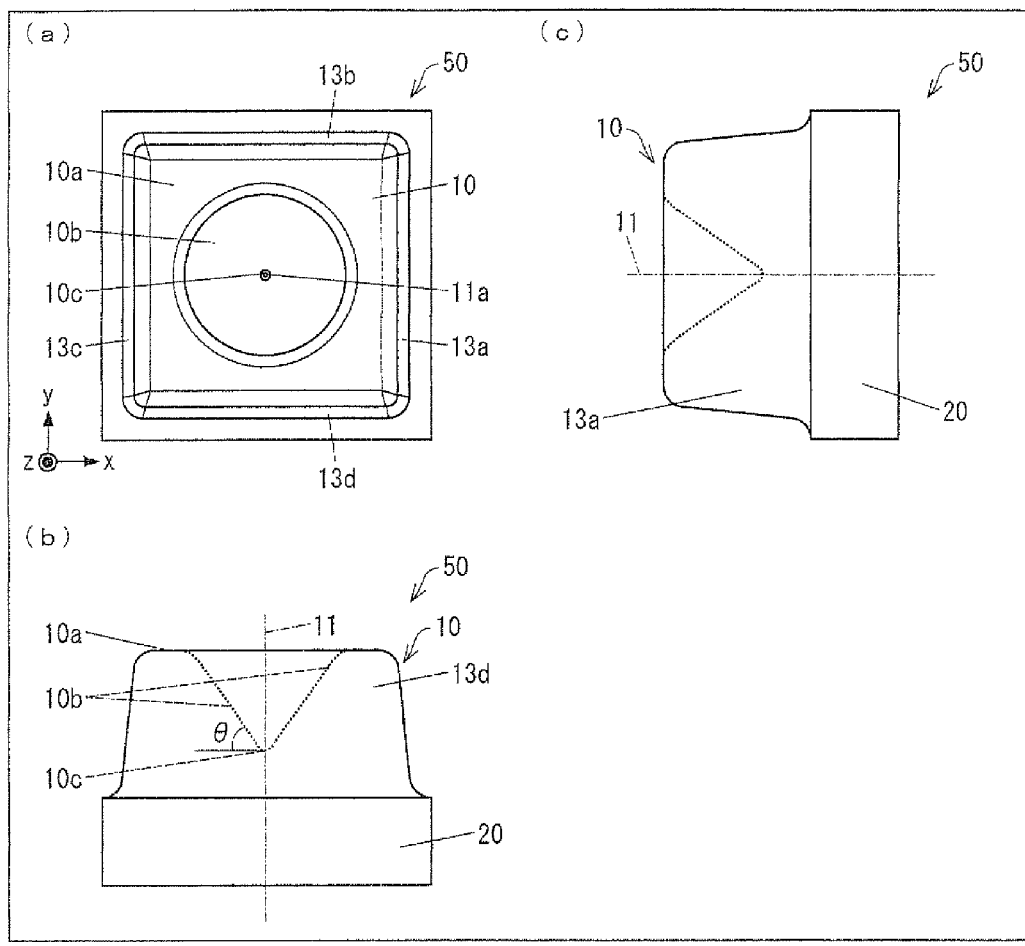
FIG. 1 is an explanatory drawing explaining a mortar-shaped or funnel-shaped light emitting device in accordance with an embodiment of the present invention. (a) of FIG. 1 is a plan view of the mortar-shaped or funnel-shaped light emitting device in accordance with the embodiment. (b) of FIG. 1 is an elevation view of the mortar-shaped or funnel-shaped light emitting device in accordance with the embodiment. (c) of FIG. 1 is a side view of the mortar-shaped or funnel-shaped light emitting device in accordance with the embodiment.

FIG. 1 is an explanatory drawing explaining a mortar-shaped or funnel-shaped light emitting device 50 in accordance with Embodiment 1 of the present invention. (a) of FIG. 1 is a plan view of the mortar-shaped or funnel-shaped light emitting device 50 in accordance with Embodiment 1. (b) of FIG. 1 is an elevation view of the mortar-shaped or funnel-shaped light emitting device 50 in accordance with Embodiment 1. (c) of FIG. 1 is a side view of the mortar-shaped or funnel-shaped light emitting device 50 in accordance with Embodiment 1.

Figure 2:
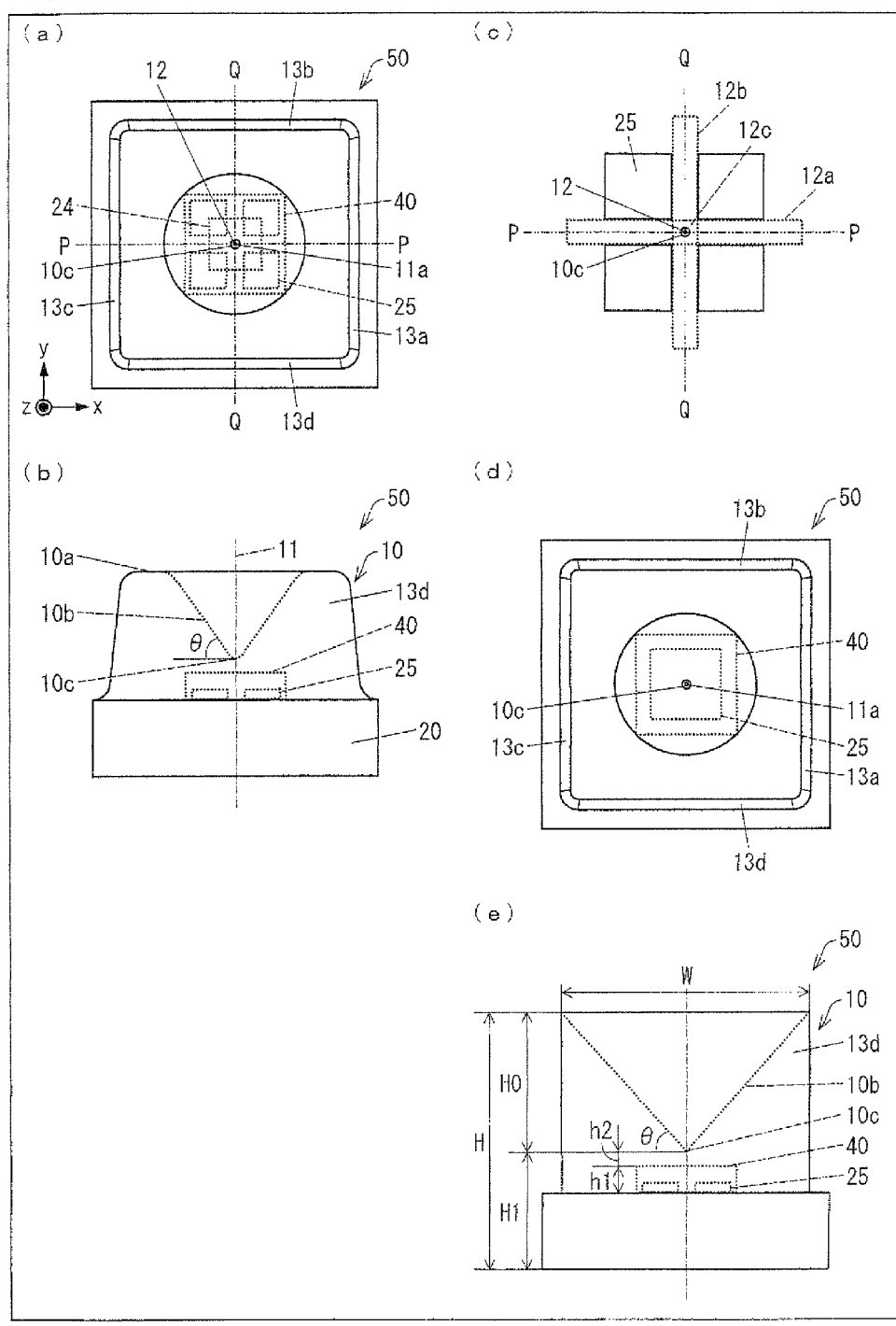
FIG. 2 is an explanatory drawing explaining a mortar-shaped or funnel-shaped light emitting device in accordance with an embodiment of the present invention. (a) of FIG. 2 is a plan view showing an inner structure of the mortar-shaped or funnel-shaped light emitting device in accordance with the embodiment. (b) of FIG. 2 is an elevation view showing the inner structure of the mortar-shaped or funnel-shaped light emitting device in accordance with the embodiment. (c) of FIG. 2 is a plan view showing a central separating region and an apex in the mortar-shaped or funnel-shaped light emitting device in accordance with the present embodiment. (d) of FIG. 2 is a plan view showing that one LED chip is die-bonded to a position where a main axis crosses a substrate in the mortar-shaped or funnel-shaped light emitting device in accordance with the present embodiment. (e) of FIG. 2 is an elevation view showing a desirable height of a sealing lens in the mortar-shaped or funnel-shaped light emitting device in accordance with the present embodiment.

FIG. 2 is an explanatory drawing explaining the mortar-shaped or funnel-shaped light emitting device 50 in accordance with Embodiment 1. (a) of FIG. 2 is a plan view showing an inner structure of the mortar-shaped or funnel-shaped light emitting device 50 in accordance with Embodiment 1. (b) of FIG. 2 is an elevation view showing the inner structure of the mortar-shaped or funnel-shaped light emitting device 50 in accordance with Embodiment 1. (c) of FIG. 2 is a plan view showing separating regions 12a and 12b between four LED chips 12, a central separating region 12c, and an apex 10c in the mortar-shaped or funnel-shaped light emitting device 50 in accordance with Embodiment 1. The central separating region 12c is a region where the two separating regions 12a and 12b overlap in (c) of FIG. 2, and the separating region 12a is a region which has a cross point of a main axis 11 and a surface of the substrate 20, whose long side is parallel to one side of the square substrate 20 and whose short side is perpendicular to the one side of the square substrate 20 on a plan view as mentioned later. The separating region 12b is obtained by rotating the separating region 12a by 90 degrees around the main axis 11. In the present embodiment, LED chips each of which is rectangular on a plan view are positioned on the substrate 20 in such a manner that one side of each of the LED chips is along with a long side of one of the separating regions 12a and 12b and the length of the short side of the separating region 12a or 12b is a separation distance between LED chips with the separating region 12a or 12b therebetween. (d) of FIG. 2 is a plan view showing that one LED chip 25 is die-bonded to a position where the main axis 11 crosses the substrate 20 in the mortar-shaped or funnel-shaped light emitting device 50 in accordance with Embodiment 1.

The outer shape of the mortar-shaped or funnel-shaped light emitting device 50 is designed such that a sealing lens 10 covering the LED chip 12 includes four side planes 13a, 13b, 13c, and 13d, the mortar-shaped or funnel-shaped light emitting device 50 has a quadrangular shape on a plan view, and a top plane 10a of the sealing lens 10 has a concave portion positioned at substantially a center portion of the substrate 20. The concave portion has substantially a conical shape which is rotationally symmetry with respect to the main axis 11. The main axis 11 is a central axis of the shape of the sealing lens 10. In the present invention, the main axis 11 is equal to a position of a later-mentioned semiconductor light emitting element (hereinafter LED chip) 25 and the central axis of the illumination shape (shape of illuminated part).

The following explains a configuration of the mortar-shaped or funnel-shaped light emitting device 50. The mortar-shaped or funnel-shaped light emitting device 50 includes the substrate 20, the LED chip 25 die-bonded to the substrate 20, a wavelength converting portion 40 covering the LED chip 25, and the sealing lens 10 covering the wavelength converting portion 40. The sealing lens 10 is directly formed on the wavelength converting portion 40 and serves as a sealer as well as a lens, and accordingly has a sufficient strength and the mortar-shaped or funnel-shaped light emitting device 50 can be downsized. A space may be provided between the sealing lens 10 and the wavelength converting portion 40 (in this case, the lens 10 does not serve as a sealing material). In particular, the space may be shaped to cause refraction of light, thereby adjusting a light distribution property.

Typical dimensions of the mortar-shaped or funnel-shaped light emitting device 50 are, for example, such that one side of the substrate 20 is 3.2 mm, one side of the sealing lens 10 is 2.8 mm and the height thereof is 1.6 mm, and one side of the LED chip 25 is 0.4 mm and the height thereof is 0.1 mm.

The substrate 20 preferably has a flat surface, is made of a material such as ceramics, resin, and metal, and has on the surface or inside the substrate 20 an electrode (not shown) for supplying power to the LED chip 25. The LED chip 25 is a nitride semiconductor light emitting element, and emits primary light which is blue light whose emission peak lies in a blue wavelength region of not less than 400 nm and not more than 500 nm in wavelength.

The LED chip 25 is die-bonded to the substrate 20 via a wax material, adhesive etc. and a p-electrode and an n-electrode on the surface of the LED chip 25 are electrically connected with two electrodes (not shown) on the substrate 20, respectively, by wire bonding. Alternatively, the LED chip 25 may be mounted on the substrate by a flip-chip process. That is, the p-electrode and the n-electrode on the surface of the LED chip 25 may be made to face the substrate so that the p-electrode and the n-electrode are electrically connected with two electrodes on the substrate, respectively. Alternatively, an LED chip having a p-electrode and an n-electrode on its front surface and rear surface, respectively, may be used. In this case, the p-electrode is connected with an electrode on the substrate by wire bonding and the n-electrode is connected with an electrode on the surface of the substrate via a conductive bonding material.

Subsequently, the wavelength converting portion 40 is obtained by coating the LED chip 25 with resin in which a fluorescent material was dispersed in advance. The fluorescent material is a material which absorbs the primary light emitted from the LED chip 25 and emits secondary light which is yellow light having an emission peak at a yellow wavelength region of not less than 550 nm and not more than 600 nm in wavelength. The mortar-shaped or funnel-shaped light emitting device 50 is designed to emit white light obtained by mixing the primary light and the secondary light.

Preferable examples of the fluorescent material include BOSE (Ba, O, Sr, Si, and Eu). Other preferable examples include SOSE (Sr, Ba, Si, O, and Eu), YAG (Ce activated yttrium, aluminum, and garnet), a sialon ((Ca), Si, Al, O, N, and Eu), and β sialon (Si, Al, O, N, and Eu).

Further, instead of the LED chip 25 with blue light emission, an ultraviolet (near-ultraviolet) LED chip of 390 nm to 420 nm in emission peak wavelength may be used to further increase emission efficiency.

Subsequently, the wavelength converting portion 40 is coated with the sealing lens 10. The sealing lens 10 is made of a material capable of transmitting emitted light, such as epoxy resin and silicone resin, and also serves as a prism for directing emitted light in a predetermined direction. The resin for the host material of the wavelength converting portion 40 may be the same as resin for the sealing lens 10, or may be resin whose refractive index is equal to or larger than the resin for the sealing lens 10.

The sealing lens 10 has four uprising side planes 13a, 13b, 13c, and 13d, and has a quadrangular outline on a plan view. These side planes are almost flat, but not required to be completely flat. These side planes are not perpendicular to the substrate, but is inclined with respect to the substrate in such a manner that these side planes are a little closer to the center as these side planes are closer to the top. Such a structure gives an advantage that when the sealing lens 10 is made of resin using a mold, the sealing lens 10 can be easily extracted from the mold. Light passing through these side planes is refracted. Accordingly, by adjusting the inclination of these side planes appropriately, it is possible to narrow or widen an illumination shape as a whole on a plane at a predetermined distance from a light emitting device. Therefore, the angles of inclinations of the side planes 13a, 13b, 13c, and 13d are determined in consideration of light distribution and evenness in the light distribution.

The sealing lens 10 includes the flat top plane 10a, and has, at the center of the top plane 10a (preferably, at main axis 11), a concave portion made of a mortar-shaped or funnel-shaped (preferably, conical) gradient 10b. Preferable shapes of the gradient 10b include, in addition to the conical one, a truncated cone, a polygonal cone, and a truncated polygonal cone. The shape of the concave portion is not required to be symmetrical with respect to the main axis 11, and may be changed appropriately in order to optimize a light distribution property. In consideration of easiness in production and continuous illumination distribution, it is preferable that transitions among the side planes 13a, 13b, 13c, and 13d are gentle and a transition between each of the side planes 13a, 13b, 13c, and 13d and the top plane 10a is gentle so as to ensure easiness in production and continuous illumination distribution.

In the case of coating the light emitting portion with the sealing lens 10 which is sealing resin having a rectangular solid shape, one concern is drop in the efficiency of extracting light due to total reflection at an interface between the outer plane of the sealing lens 10 and air, in particular between the gradient 10b constituting the concave portion and air. However, as in the mortar-shaped or funnel-shaped light emitting device 50 in accordance with Embodiment 1, by providing the center of the sealing lens 10 with a relatively large concave portion and by designing the height of the sealing lens 10 to be at least one-third, more preferably one-second or more enables realizing a light-extraction efficiency substantially equal to that of a later-mentioned domed light emitting device 60.

As shown in (a) of FIG. 2, the four LED chips 25 are die-bonded to apexes, respectively, of a virtual square 24 centering the main axis 11, which square is indicated by a chain double-dashed line on the surface of the substrate 20. In this configuration, an apex 10c of the mortar-shaped or funnel-shaped gradient 10b formed in the top plane 10a of the sealing lens 10 is positioned in such a manner that the main axis 11 passes through the apex 10c. Similarly, an intersection point of two lines PP and QQ (indicated by chain double-dashed lines) which respectively pass through the centers of the separating regions 12a and 12b between adjacent two of the LED chips 25 is positioned in such a manner that the main axis 11 passes through the intersection point. That is, on a plan view of (a) of FIG. 2, the apex 10c and the intersection point 12 are substantially equal to each other.

With the arrangement, even if the die-bonding position of the LED chip 25 is a little out of place in an x-direction or y-direction, or even if the position of the apex 10c of the mortar-shaped or funnel-shaped gradient 10b is a little out of place in the x-direction or y-direction, the apex 10c is positioned to be within the central separating region 12c of the LED chip shown in (c) of FIG. 2 on a plan view, and consequently the four LED chips 25 are arranged substantially evenly in four directions, respectively. Therefore, a light distribution property of the mortar-shaped or funnel-shaped light emitting device 50 is highly and stably symmetrical with respect to planes obtained by extending the lines PP and QQ in a direction perpendicular to the substrate.

The following makes a more detailed explanation with reference to (b) of FIG. 2. On a cross sectional view, the mortar-shaped or funnel-shaped gradient 10b is constituted by two gradients with the apex 10c therebetween, and so reflection of light which is emitted from the LED chip 25 and is incident to the gradient 10b and a refraction characteristic of the light must be considered with respect to each gradient. In other words, although the two gradients have the same inclination and so have the same reflection of light and the same refraction characteristic of the light with respect to an incident angle of the light, symmetrical position of the two gradients should be taken into consideration. In a case where only one LED chip 25 is positioned right below the apex 10c, if the LED chip is shifted with respect to the apex 10c in one direction, the amount of incident light increases at the mortar-shaped or funnel-shaped gradient right below which the center of the LED chip 25 is positioned, but the amount of the incident light drops at the mortar-shaped or funnel-shaped gradient right below which the center of the LED chip 25 is not positioned, because the mortar-shaped or funnel-shaped gradient right below which the center of the LED chip 25 is positioned shades the mortar-shaped or funnel-shaped gradient right below which the center of the LED chip 25 is not positioned. This is likely to result in unbalance in extraction of light between the two gradients. However, in a case where separate LED chips are positioned right below the two gradients extending from the apex 10c, light emitted from the LED chip positioned on one gradient is hardly incident to the other gradient, and hardly contributes to incident light to the other gradient. In a case where the LED chip right below the gradient is shifted left or right but does not exceed the apex 10c, when an inclination angle of the gradient 10b is set to be constant, an incident angle of light from the LED chip to one gradient does not change, so that the balance in extracting light between the two gradients is hardly lost.

Summing up the above, in a case where LED chips are positioned not right below the apex 10 but below one of two gradients, or not right below the apex 10 but below two gradients, respectively, the balance in extraction of light between the two gradients as a light emitting device is less likely to be lost, even when the positions of the LED chips are shifted to such an extend the LED chips do not cross the apex 10c.

The above explanation was made on the assumption that the wavelength converting portion 40 is shifted in accordance with shift of the LED chips 25.

Further, the LED chips 25 are surrounded by the wavelength converting portion 40 in which particulate fluorescent material is dispersed. A part (primary light) of light emitted from the LED chips 25 is absorbed by the fluorescent material, which isotropically emits secondary light whose wavelength is longer than that of the primary light. Another part of the light emitted from the LED chips 25 is scattered by the fluorescent material, and further another part is transmitted by the fluorescent material without being absorbed or scattered by the fluorescent material. Thus, the fluorescent material itself serves as a point light source, which should be taken into consideration. However, the light emitted from the fluorescent material and the light scattered by the fluorescent material are greatly influenced by light emitted from the LED chip closer to the fluorescent material, and accordingly the influence of shift of the position of an LED chip on extraction of light may be roughly considered as above.

The central separating region 12c for the LED chips 25 is a region where the two separating regions 12a and 12b between the LED chips 25 cross each other.

As shown in (d) of FIG. 2, only one LED chip 25 may be die-bonded at a position where the substrate 20 crosses the main axis 11. In this case, it is essential to strictly manage production so that the main axis 11 penetrates the center of the LED chip 25, thereby distributing light evenly in all directions. Consequently, difficulty in stably producing products with the same light distribution property is higher in this case than the case where the four LED chips are positioned evenly as in (a) of FIG. 2.

Due to insufficient accuracy in production, the apex 10c of the mortar-shaped or funnel-shaped light emitting device is difficult to be shaped to have a sharpened point. Further, the position of the LED chip 25 shown in (d) of FIG. 2 has a problem of great leakage of light in an axis direction. Therefore, in order to produce light emitting devices with stable properties, it is particularly preferable that the LED chips 25 are shifted from a position right below the apex 10c as shown in (a) of FIG. 2.

Figure 3:
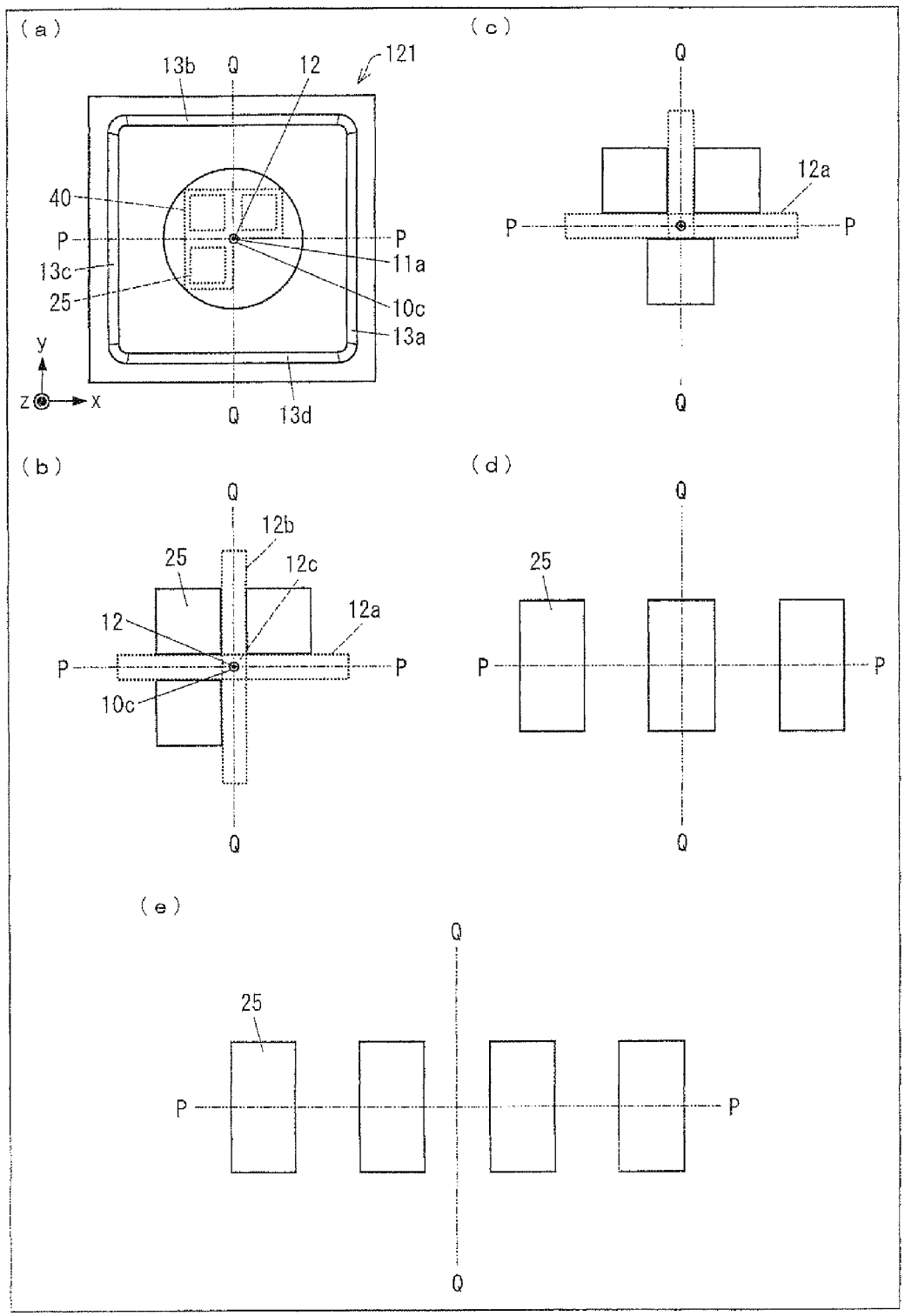
FIG. 3 is an explanatory drawing explaining a mortar-shaped or funnel-shaped light emitting device in accordance with an embodiment of the present invention. (a) of FIG. 3 is a plan view showing an internal structure of the mortar-shaped or funnel-shaped light emitting device in accordance with the embodiment. (b) and (c) of FIG. 3 are enlarged views showing LED chips and their surroundings in the mortar-shaped or funnel-shaped light emitting device in accordance with the embodiment. (d) of FIG. 3 shows a plan view of an example in which three LED chips having an oblong shape are arranged. (e) of FIG. 3 shows a plan view of an example in which four LED chips having a rectangular shape are arranged.

In the example shown in FIG. 2, there are four LED chips 25. In the example shown in FIG. 3, there are three LED chips 25. FIG. 3 is an explanatory drawing explaining a mortar-shaped or funnel-shaped light emitting device 121 in accordance with Embodiment 1 of the present invention. (a) of FIG. 3 is a plan view showing an internal structure of the mortar-shaped or funnel-shaped light emitting device 121 in accordance with Embodiment 1. (b) and (c) of FIG. 3 are enlarged views showing LED chips and their surroundings in the mortar-shaped or funnel-shaped light emitting device 121 in accordance with Embodiment 1. The position of the LED chips 25 may be a one shown in (c) of FIG. 3, but the position shown in (b) of FIG. 3 ensures more stable light distribution. Accordingly, the position shown in (b) of FIG. 3 is more preferable in production.

Figure 4:
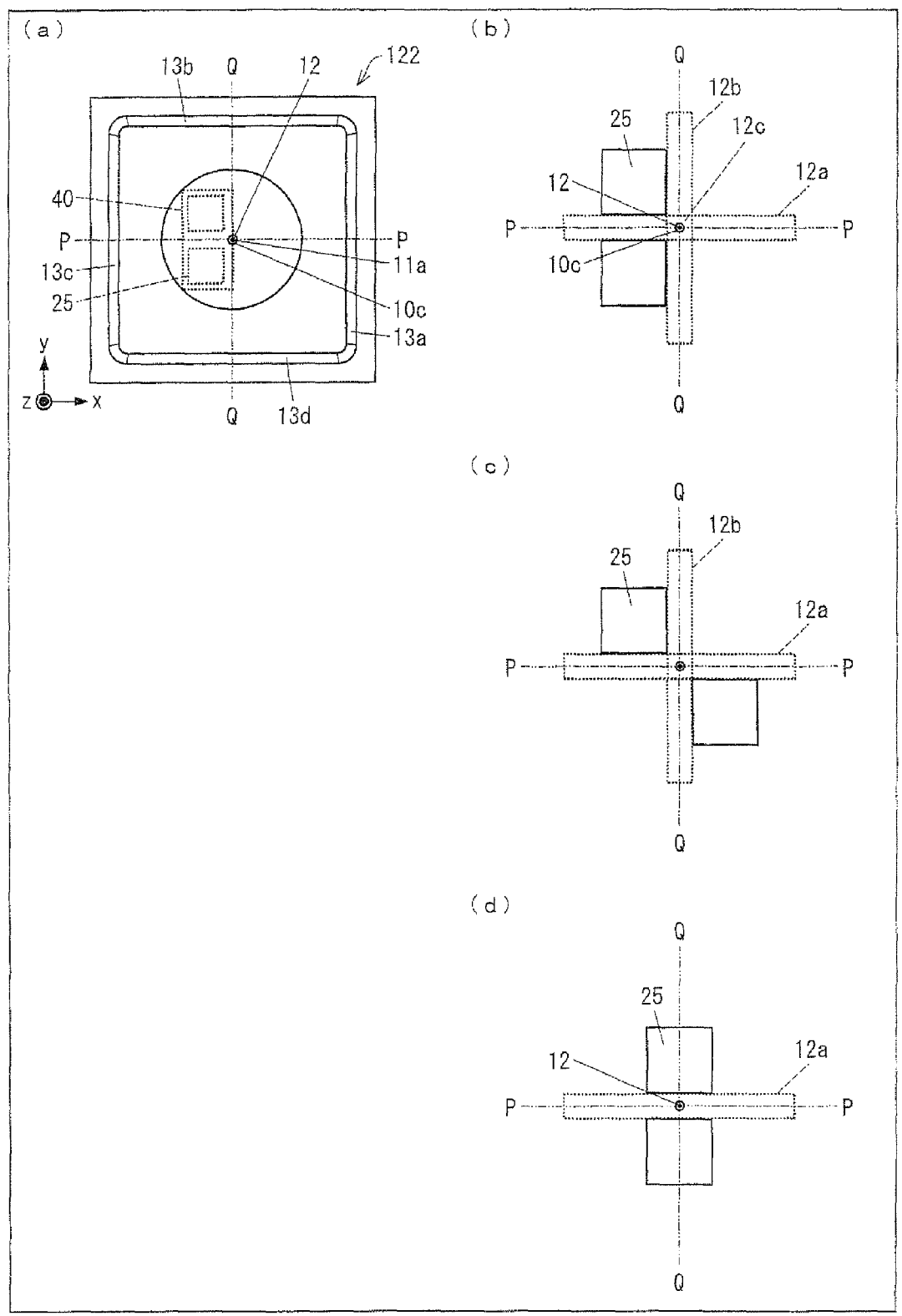
FIG. 4 is an explanatory drawing explaining a mortar-shaped or funnel-shaped light emitting device in accordance with an embodiment of the present invention. (a) of FIG. 4 is a plan view showing an internal structure of the mortar-shaped or funnel-shaped light emitting device in accordance with the embodiment. (b)-(d) of FIG. 4 are enlarged views showing LED chips and their surroundings in the mortar-shaped or funnel-shaped light emitting device in accordance with the embodiment.

FIG. 4 is an explanatory drawing explaining a mortar-shaped or funnel-shaped light emitting device 122 in accordance with Embodiment 1 of the present invention. (a) of FIG. 4 is a plan view showing an internal structure of a modification example of the position of the LED chips in the mortar-shaped or funnel-shaped light emitting device 122 in accordance with Embodiment 1. This modification example have two LED chips. (b)-(d) of FIG. 4 are enlarged views showing LED chips and their surroundings in the mortar-shaped or funnel-shaped light emitting device 122 in accordance with Embodiment 1, and show the position of LED chips shown in (a) of FIG. 4 and modification examples of the positions of the LED chips which are different from the position shown in (a) of FIG. 4.

In (a) and (b) of FIG. 4, the LED chips are positioned in such a manner that one sides of the LED chips are along the common long side of the separating region 12b which is the same as the separating region 12b shown in FIG. 2 and that another sides perpendicular to the one sides of the LED chips are along facing long sides of the separating region 12a, respectively, and the LED chips face each other with the separating region 12a therebetween.

In (c) of FIG. 4, LED chips are positioned in such a manner that one sides of the LED chips and another sides perpendicular to the one sides of the LED chips are along facing long sides of the separating region 12a and 12b, respectively, the LED chips sandwich the separating region 12a or 12b, the LED chips are positioned to be along a diagonal of the substrate, and the LED chips are positioned symmetrically with respect to the main axis 11.

In (d) of FIG. 4, LED chips are positioned in such a manner that one sides of the LED chips are along facing long sides of the separating region 12a, respectively, the LED chips sandwich the separating region 12a, and another sides perpendicular to the one sides of the LED chips are parallel to a line perpendicular to the long sides of the separating region 12a.

Further, the LED chips are positioned in such a manner that a line perpendicular to long sides of the separating region 12a which passes through the main axis 11 passes through the centers of the LED chips.

The position of the LED chips 25 may be a one shown in (d) of FIG. 4. However, as shown in (b) of FIG. 2, the position shown in (b) of FIG. 4 and the position shown in (c) of FIG. 4 ensure more stable light distribution. Accordingly, the position shown in (b) of FIG. 4 and the position shown in (c) of FIG. 4 are more preferable in production.

In the plan views, the LED chip is a square. Alternatively, the LED chip may be an oblong. In this case, in order to downsize the wavelength converting portion 40, the LED chips may be positioned in such a manner that, for example, long sides of the LED chips are parallel to each other. For example, (d) of FIG. 3 shows a plan view of an example in which three LED chips 25 having a rectangular shape are arranged. (e) of FIG. 3 shows a plan view of an example in which four LED chips 25 having a rectangular shape are arranged. The LED chips are positioned to be parallel to a line PP passing through the LED chips.

Further, it is preferable that the wavelength converting portion 40 which covers the LED chip 25 and which is made of transparent resin in which a fluorescent material has been dispersed in advance is positioned to be internally from the opening (portion where the top plane and the gradient abut) of the mortar-shaped or funnel-shaped gradient 10b. This enables arranging light from the wavelength converting portion 40, i.e. light from the LED chip 25 and light from the fluorescent material dispersed in the wavelength converting portion 40 such that light which directly passes through the top plane 10a and travels in a right-above direction of the light emitting device is reduced and light incident to the gradient 10b is increased. Consequently, a much amount of light is reflected by the gradient 10b and is introduced from the side plane 13a to the side plane 13d. Thus, it is possible to achieve a light emitting device with a wide angle light distribution property as shown in (a) and (b) of FIG. 6 which will be mentioned later.

Figure 5:
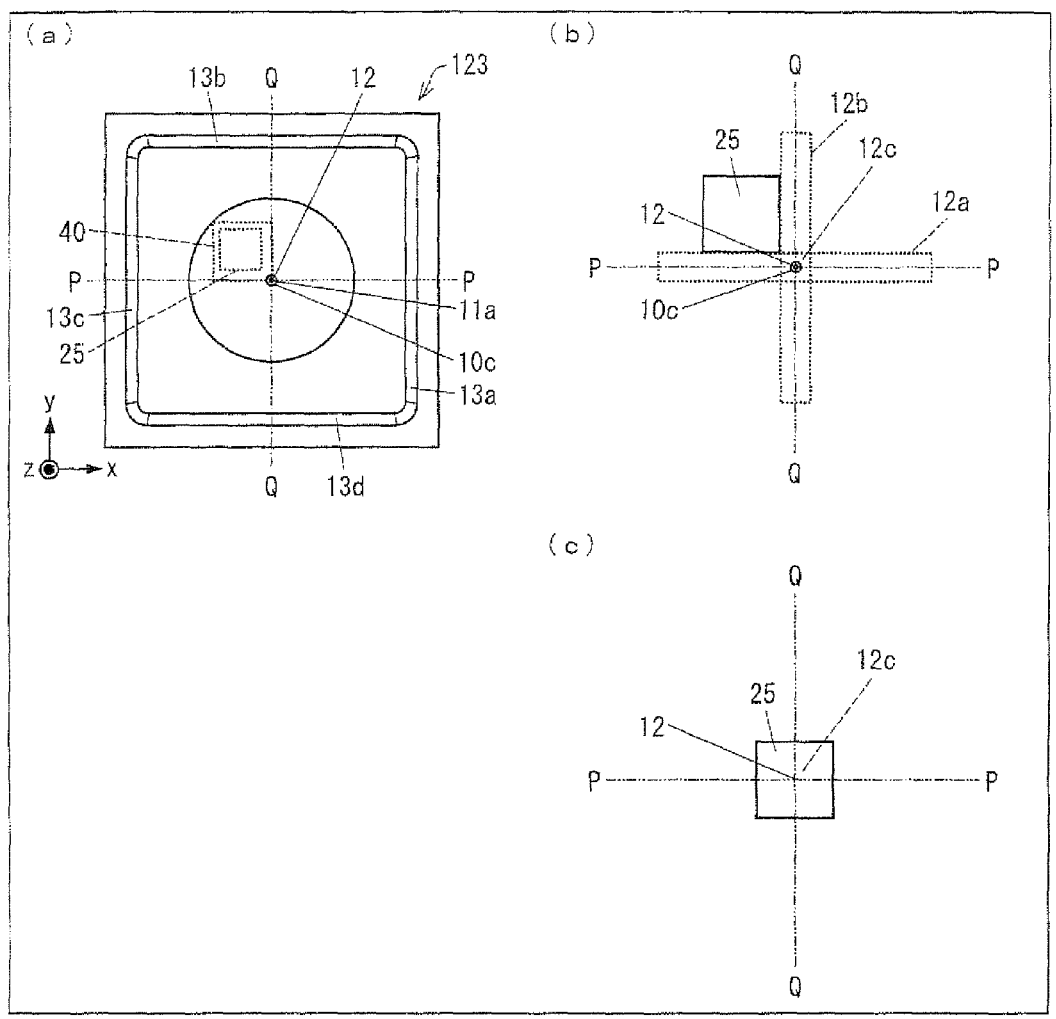
FIG. 5 is an explanatory drawing explaining a mortar-shaped or funnel-shaped light emitting device in accordance with an embodiment of the present invention. (a) of FIG. 5 is a plan view showing an internal structure of the mortar-shaped or funnel-shaped light emitting device in accordance with the present embodiment. (b) and (c) of FIG. 5 are enlarged views showing LED chips and their surroundings in the mortar-shaped or funnel-shaped light emitting device in accordance with the present embodiment.

FIG. 5 is an explanatory drawing explaining a mortar-shaped or funnel-shaped light emitting device 123 in accordance with Embodiment 1 of the present invention. (a) of FIG. 5 is a plan view showing an internal structure of the mortar-shaped or funnel-shaped light emitting device 123 in accordance with Embodiment 1. (b) and (c) of FIG. 5 are enlarged views showing LED chips and their surroundings in the mortar-shaped or funnel-shaped light emitting device 123 in accordance with Embodiment 1. The position of the LED chips 25 may be a one shown in (c) of FIG. 5, but the position shown in (b) of FIG. 5 ensures more stable light distribution. Accordingly, the position shown in (b) of FIG. 5 is more preferable in production.

The above explanations are directed to the position of the apex 10c of the mortar shape in a direction horizontal to the substrate.

With reference to the elevation view shown in (b) of FIG. 2, the following explains the position of the apex 10c of the mortar shape in a direction perpendicular to the substrate. It is desirable that the apex 10c is positioned as closely as possible to the substrate 20 or the LED chip. Such position enables light from the LED chip 25 to be introduced more efficiently by the mortar-shaped or funnel-shaped gradient 10b to the four planes uprising from the periphery of the sealing lens 10. This is because such position enables a solid angle at the time of viewing the mortar-shaped or funnel-shaped gradient 10b from the LED chip 25 to be larger.

However, it is desirable that the apex 10c of the mortar shape does not contact the wavelength converting portion 40. This is because if the apex 10c would contact the wavelength converting portion 40 containing the fluorescent material or be partially embedded in the wavelength converting portion 40, light excited by the fluorescent material would leak from the contact portion or the embedded portion so that light intensity on the axis would be increased.

Summing up the above, it is desirable that the apex 10c of the mortar shape is positioned as closely as possible to the substrate provided that the apex 10c do not contact the wavelength converting portion 40.

Figure 6:
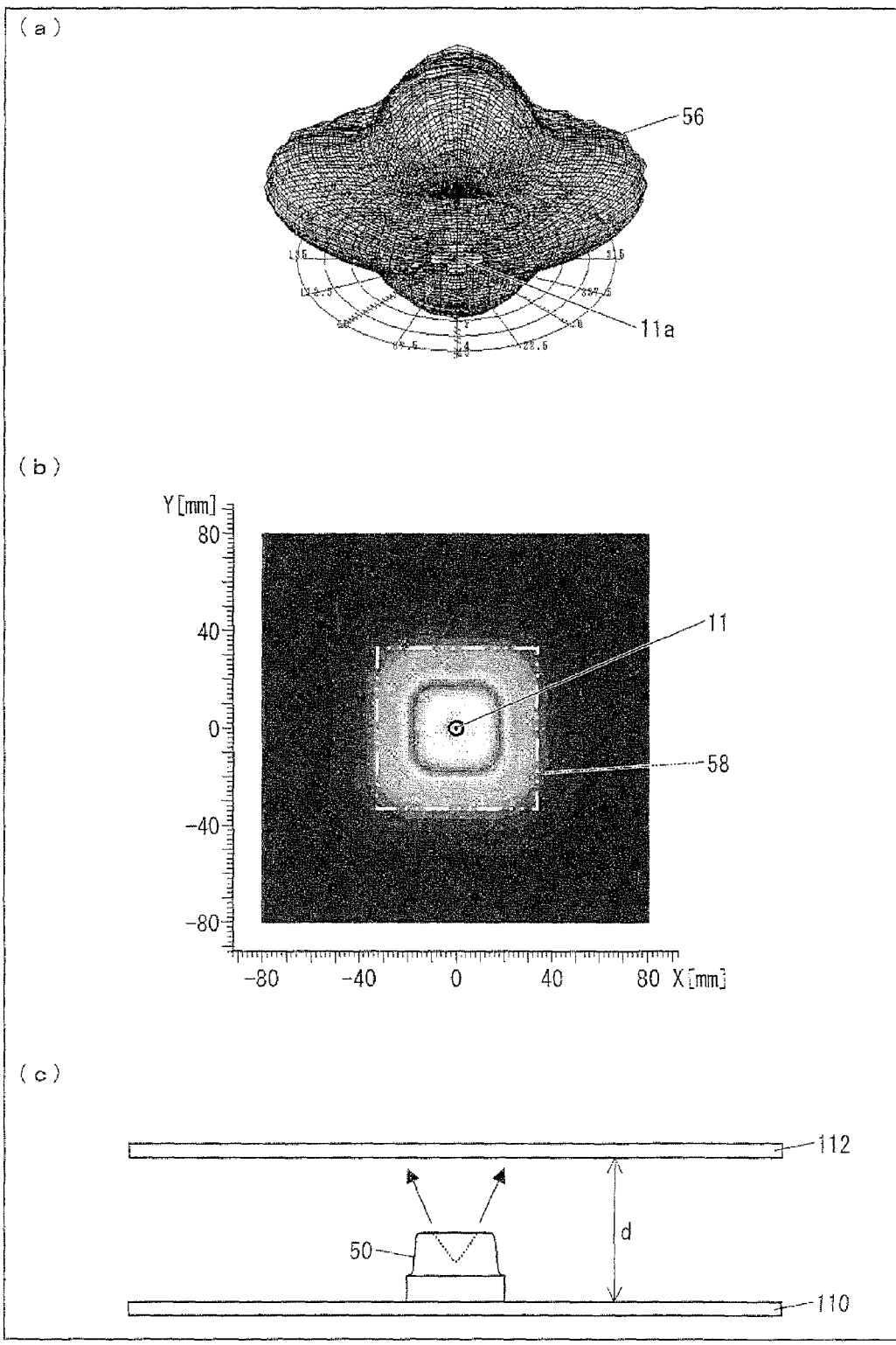
FIG. 6 is a drawing showing a light distribution property of a mortar-shaped or funnel-shaped light emitting device in accordance with an embodiment of the present invention, an illumination shape of the light emitting device, and a method for evaluating the illumination shape. (a) of FIG. 6 is a simulation view three-dimensionally showing the light distribution property of the mortar-shaped or funnel-shaped light emitting device in accordance with the embodiment. (b) of FIG. 6 is a simulation view showing the illumination shape of the mortar-shaped or funnel-shaped light emitting device in accordance with the embodiment. (c) of FIG. 6 shows how to evaluate the illumination shape of the mortar-shaped or funnel-shaped light emitting device in accordance with the embodiment.

FIG. 6 is a drawing showing a light distribution property of the mortar-shaped or funnel-shaped light emitting device 50 in accordance with Embodiment 1, an illumination shape of the light emitting device 50, and a method for evaluating the illumination shape. (a) of FIG. 6 is a simulation view three-dimensionally showing the light distribution property of the mortar-shaped or funnel-shaped light emitting device 50 in accordance with Embodiment 1, and a distance from a center 11a to an outer surface 56 indicates intensity of emitted light.

(b) of FIG. 6 is a simulation view showing the illumination shape of the mortar-shaped or funnel-shaped light emitting device 50 in accordance with Embodiment 1. The illumination shape used herein indicates, as mentioned later, an illumination shape obtained when illuminating a diffusing plate 112, and the chain double-dashed line in the drawing indicates a contour 58. As seen from the drawing, the illumination shape of the mortar-shaped or funnel-shaped light emitting device 50 is not concentric and not axially symmetrical. The mortar-shaped or funnel-shaped light emitting device 50 forms a substantially rectangular (hereinafter rectangular) illumination shape in particular on the diffusing plate 112. In other words, there are four bright portions in diagonal directions.

(c) of FIG. 6 shows how to evaluate the illumination shape of the mortar-shaped or funnel-shaped light emitting device 50 in accordance with Embodiment 1. The mortar-shaped or funnel-shaped light emitting device 50 is mounted on a mounting substrate 110, and the diffusing plate 112 is positioned to face the mounting substrate 110. When the mortar-shaped or funnel-shaped light emitting device 50 illuminates the diffusing plate 112 from its backside, the illumination shape is observed from the front side of the diffusing plate 112.

In the above observation, a distance d from the mounting substrate 110 to the diffusing plate 112 is set to 18 mm.

The illumination shape in the above observation is a one observed via the diffusing plate 112. On the other hand, in the simulation view showing the illumination shape in accordance with the present embodiment, although the illumination shape is obtained by simulation and indicates a one on a view plane right before light is incident to the diffusing plate 112, this illumination shape may be considered as being equal to the illumination shape observed via the diffusing plate 112.

Figure 7:
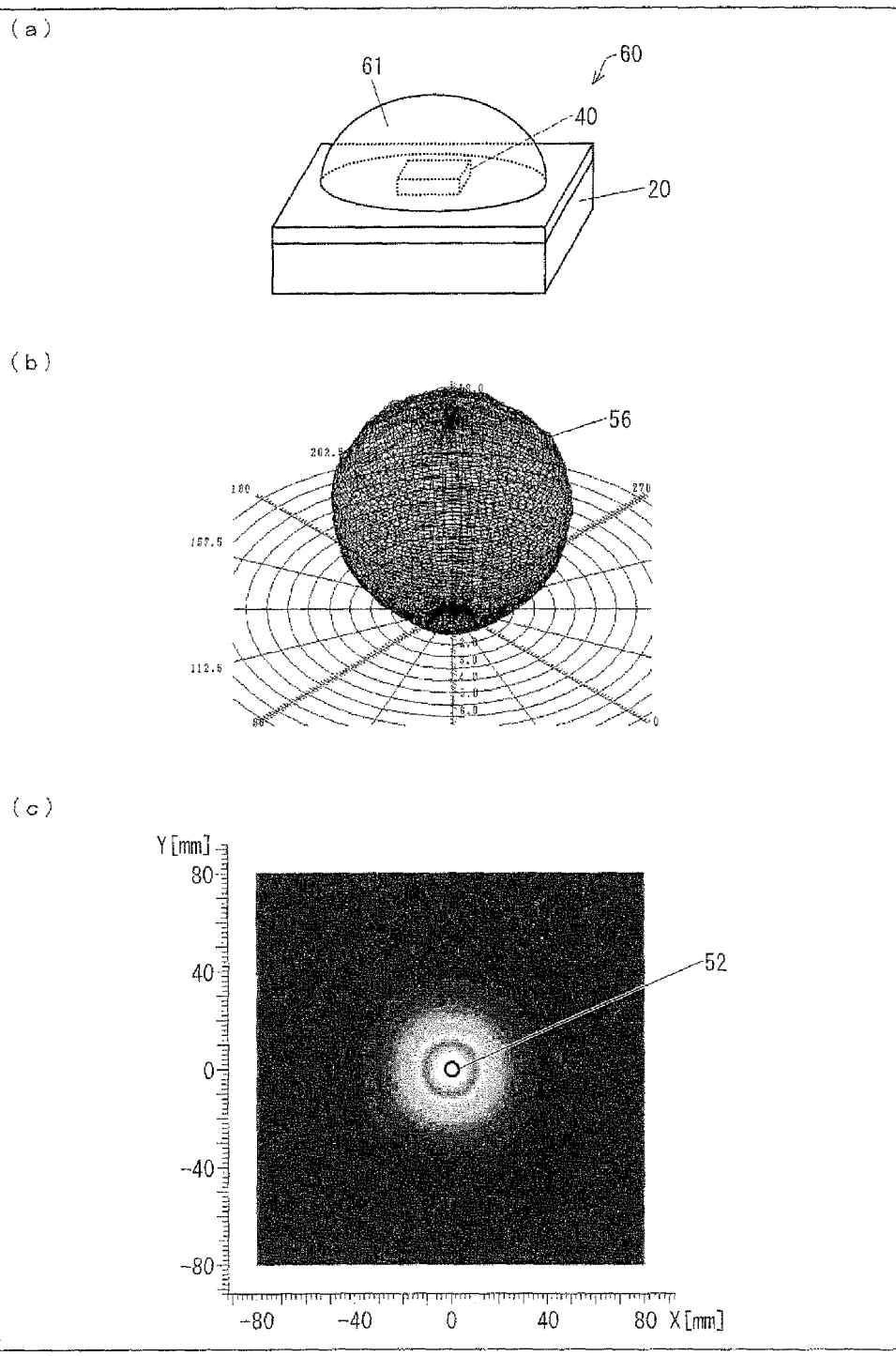
FIG. 7 is a drawing showing a shape, a light distribution property, and an illumination shape of a domed light emitting device. (a) of FIG. 7 is a perspective view showing the domed light emitting device. (b) of FIG. 7 is a simulation view three-dimensionally showing the light distribution property of the domed light emitting device. (c) of FIG. 7 is a simulation view showing the illumination shape of the domed light emitting device.

FIG. 7 is a drawing showing the shape, the light distribution property, and the illumination shape of a domed light emitting device for comparison. (a) of FIG. 7 is a perspective view showing a domed light emitting device 60 including a substrate 20, an LED chip 25 (not shown) die-bonded to the substrate 20, a wavelength converting portion 40 with which the LED chip 25 is coated, and a domed sealer with which the wavelength converting portion 40 is coated.

(b) of FIG. 7 is a simulation view three-dimensionally showing a light distribution property of the domed light emitting device 60 of a comparative example. (c) of FIG. 7 is a simulation view showing the illumination shape of the domed light emitting device 60. As seen from the drawings, the light distribution property of the domed light emitting device 60 is spherical in the three-dimensional simulation view, and the illumination shape of the domed light emitting device 60 is concentric with respect to a bright portion 52 positioned above the LED chip 25.

Comparison of the illumination shape of the mortar-shaped or funnel-shaped light emitting device 50 with the illumination shape of the domed light emitting device 60 shows that the mortar-shaped or funnel-shaped light emitting device 50 has a wider illumination area per one light emitting device than that of the domed light emitting device 60.

Figure 8:
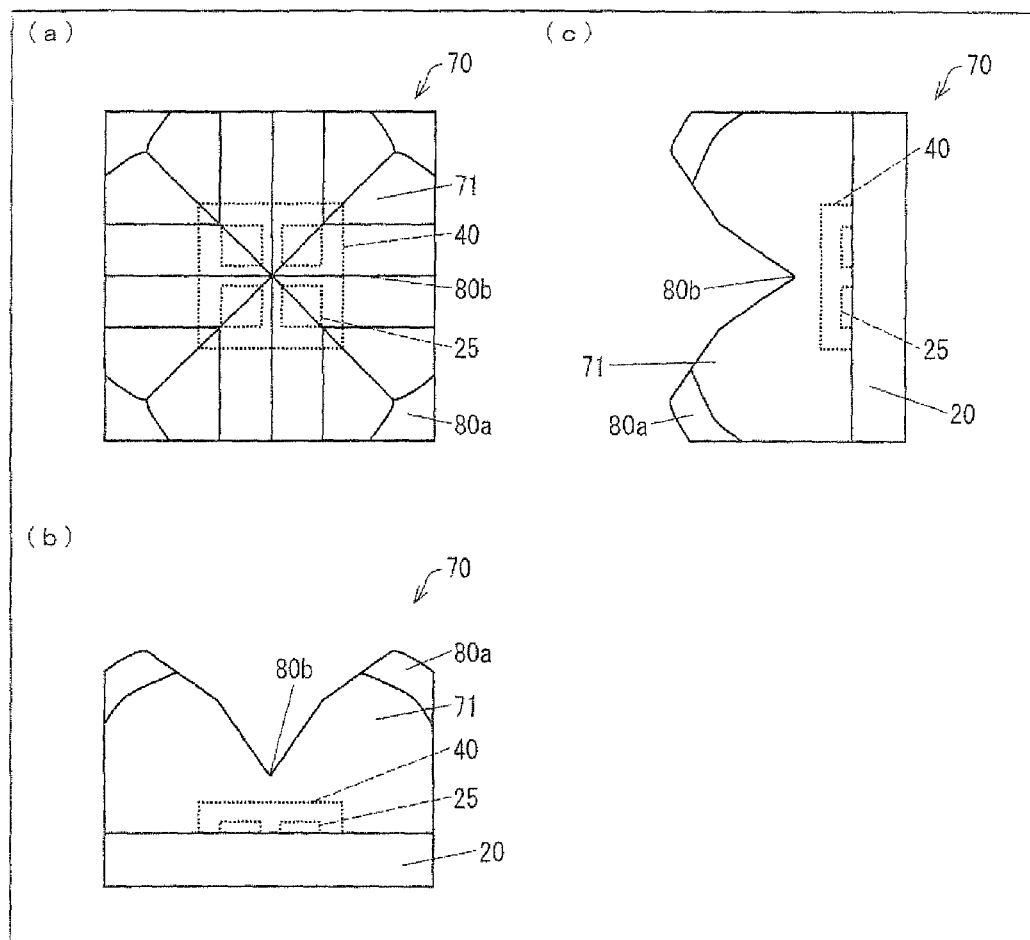
FIG. 8 is drawing showing a shape of a four-leaved light emitting device. (a) of FIG. 8 is a plan view of the four-leaved light emitting device. (b) of FIG. 8 is an elevation view of the four-leaved light emitting device. (c) of FIG. 8 is a side view of the four-leaved light emitting device.
Figure 9:
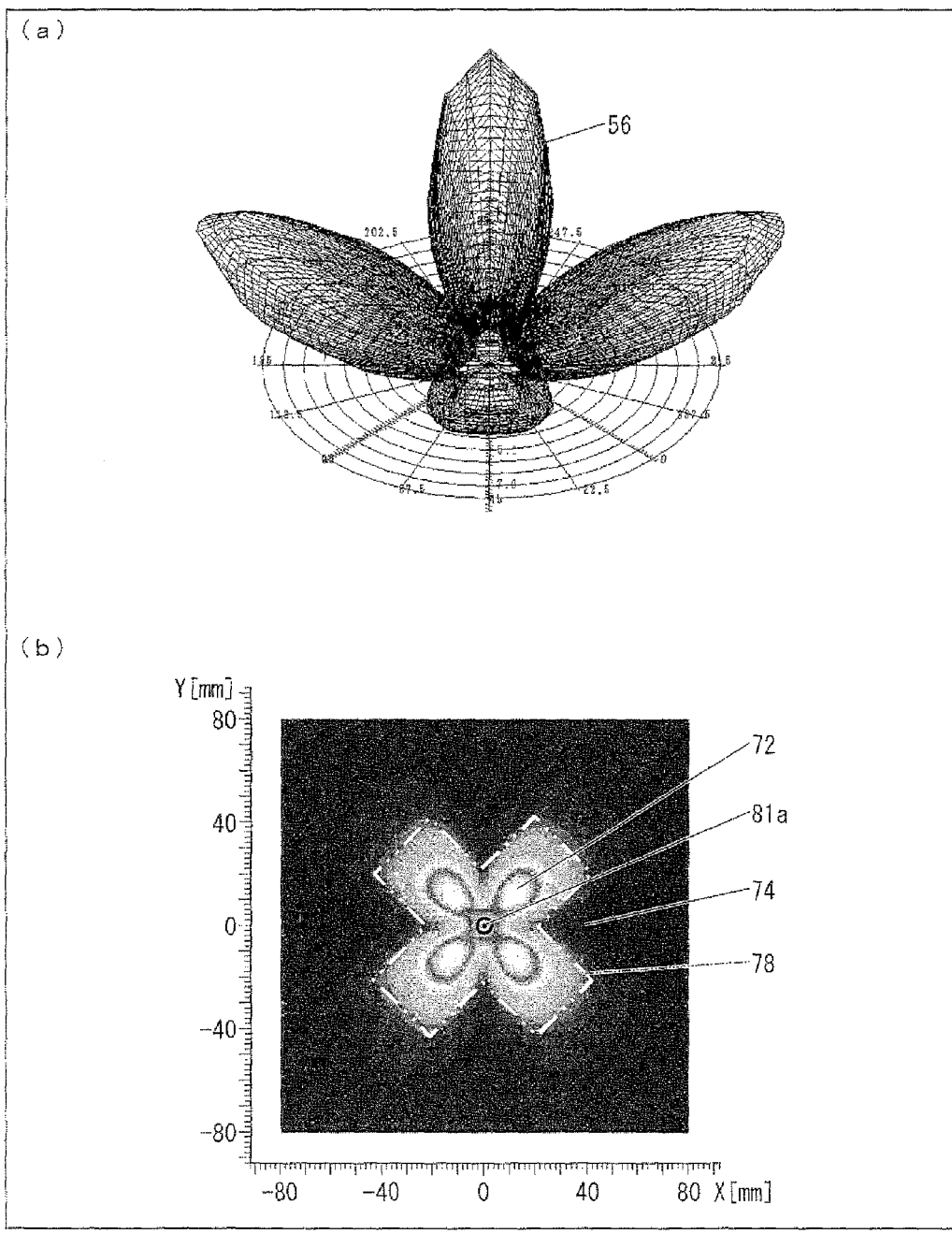
FIG. 9 is a drawing showing a light distribution property and an illumination shape of the four-leaved light emitting device. (a) of FIG. 9 is a simulation view three-dimensionally showing the light distribution property of the four-leaved light emitting device. (b) of FIG. 9 is a simulation view showing the illumination shape of the four-leaved light emitting device.

FIGS. 8 and 9 are drawings showing the shape, the light distribution property, and the illumination shape of a four-leaved light emitting device 70 for comparison. (a) of FIG. 8 is a plan view of the four-leaved light emitting device 70. (b) of FIG. 8 is an elevation view of the four-leaved light emitting device 70. (c) of FIG. 8 is a side view of the four-leaved light emitting device 70.

The four-leaved light emitting device 70 includes a substrate 20, four LED chips 25 die-bonded to the substrate 20, a wavelength converting portion 40 with which the LED chip 25 is coated and in which fluorescent material particles are dispersed, and a block sealer (sealing lens) 71 including four mountainous portions 80a with which the wavelength converting portion 40 is coated. As shown in (a) of FIG. 8 which is a plan view, the four mountainous portions 80a are formed by forming a groove-shaped valley portion 80b which extends in upper and lower directions and right and left directions of the drawing. The valley portions 80a are also shown in (b) of FIG. 8 which is an elevation view and in (c) of FIG. 8 which is a side view. In the drawings, the mountainous portions 80a are designed to be gently inclined downward to four ends of the four-leaved light emitting device 70 on a plan view. Alternatively, the mountainous portions 80a may be flat.

(a) of FIG. 9 is a simulation view three-dimensionally showing the light distribution property of the four-leaved light emitting device 70 of a comparative example. (b) of FIG. 9 is a simulation view showing the illumination shape of the four-leaved light emitting device 70. According to the drawings, the illumination shape of the four-leaved light emitting device 70 is indicated by a contour 78 indicated by the chain double-dashed line in (b) of FIG. 9, a bright portion surrounded by the contour 78 is a bright portion 72 with high illuminance, and a dark portion near the bright portion is a dark portion 74 with low illuminance.

As described above, in the illumination shape of the four-leaved light emitting device 70, the four bright portions 72 and the dark portion 74 are distributed in such a manner that the four bright portions 72 correspond to the upper portions of the mountainous portions 80a and the dark portion 74 corresponds to the upper portion of the valley portion 80b. Consequently, the illumination shape of the four-leaved light emitting device 70 resembles to an x-character which is four-fold symmetrical with respect to the center 81a as with the shape of the sealer 71.

Comparison in the illumination shape between the mortar-shaped or funnel-shaped light emitting device 50 and the four-leaved light emitting device 70 shows that the mortar-shaped or funnel-shaped light emitting device 50 emits light also to a portion constituting the four dark portions 74 in the four-leaved light emitting device 70. Since the portions corresponding to the four dark portions 74 are brighter in the mortar-shaped or funnel-shaped light emitting device 50, portions corresponding to the four bright portions 72 have reduced illuminance. Consequently, the mortar-shaped or funnel-shaped light emitting device 50 achieves a substantially rectangular illumination shape whose corners correspond to the four bright portions 72 in the illumination shape of the four-leaved light emitting device 70.

In the mortar-shaped or funnel-shaped light emitting device 50, the sealing lens 10 (mortar-shaped or funnel-shaped lens) not only serves as a lens but also serves as a material that seals the LED chip 25 and the wavelength converting portion 40. Alternatively, a mortar-shaped or funnel-shaped lens and a sealing material are provided separately and the mortar-shaped or funnel-shaped lens is attached to the normal sealing material that seals an LED chip. In this case, it is preferable to fill a space between the sealing material and the mortar-shaped or funnel-shaped lens with other transparent resin etc. in order to improve efficiency in extracting light. Alternatively, the space between the sealing material and the mortar-shaped or funnel-shaped lens may be void without any filler.

However, it is most preferable to design the mortar-shaped or funnel-shaped lens to also serve as the sealing material as described in Embodiment 1, since this design enables easy and accurate positioning of a lens, an increase in efficiency in extracting light, and easiness in production due to simultaneity of lens production and resin sealing.

It is desirable that an inclination angle θ of the mortar-shaped or funnel-shaped gradient 10b is steeper than a critical angle θc of total reflection, and it is further desirable that the inclination angle θ ranges from approximately the critical angle θc to 60°. The total reflection used herein indicates total reflection between sealing resin and air. When the refractive index of the sealing resin is n, the critical angle θc of the total reflection is obtained by arcsin(1/n). By setting the inclination angle of the mortar-shaped or funnel-shaped gradient 10b to be θc or more, it is possible to efficiently introduce strong light emitted in the axis direction or its neighboring direction of the LED chip 25 to the four planes uprising from the periphery of the sealing lens 10, thereby contributing to formation of a substantially rectangular illumination shape by light having passed through the four planes.

On the other hand, when the inclination angle θ is 60° or larger, more amount of light which is emitted from the LED chip 25 in the axis direction is reflected by the gradient and travels to the top plane 10a, and consequently it is impossible to efficiently introduce light to the four planes uprising from the periphery of the sealing lens 10. Consequently, even if the illumination shape is rectangular, it is impossible to obtain a sufficient illumination area. Further, as the inclination angle of the mortar-shaped or funnel-shaped gradient would be steeper, the concave portion would be deeper and the height of the device would be larger. This would make it difficult to wholly cover the LED chip 25.

In consideration of the above, it is desirable that the inclination angle θ of the mortar-shaped or funnel-shaped gradient 10b ranges from approximately the critical angle θc of the total reflection to 60°. When resin with a typical value of n=1.5 is used, the critical angle θc is 41.8°.

In the above, the explanation of the role of the gradient 10b was mainly directed to the total reflection of light. However, transmission of light is also an important role of the gradient 10b. A part of light emitted from the LED chip 25 or the wavelength converting portion 40 is transmitted with no refraction or with a little refraction by the gradient 10b or the top plane 10a in the right-above direction of the LED chip 25 of the wavelength converting portion 40. Consequently, the light also travels right on the main axis 11. Accordingly, as shown in (a) and (b) of FIG. 6, the mortar-shaped or funnel-shaped light emitting device 50 has a light distribution property such that light is emitted in a predetermined range widely extending from the main axis 11 to both sides. Further, in order that light emitted toward the top plane 10a is extracted from the sealing lens with refraction from the right-above direction of the LED chip 25 or the wavelength converting portion 40 to a skew direction, it is preferable that the top plane 10a is optically flat. The gradient is not necessarily a plane on a cross sectional view, and may be curved on a cross sectional view.

As described above, it is desirable that the apex 10c of the mortar shape is positioned as closely as possible to the substrate provided that the apex 10c does not contact the wavelength converting portion 40. In consideration of this requirement as well as the requirement that the inclination angle θ of the mortar-shaped or funnel-shaped gradient 10b ranges from approximately critical angle θc of the total reflection to 60°, the upper limit of the desirable height of the sealing lens 10 (H in (e) of FIG. 2) is inevitably determined with respect to W indicative of the width of the sealing lens 10.

When the gradient 10b of the mortar shape is designed to be as wide as possible, the depth of the gradient 10b (H0 in (e) of FIG. 2) is generally 0.45 times to 0.86 times with respect to the width of the sealing lens 10 (W in (e) of FIG. 2). In view of (e) of FIG. 2, H0 is calculated based on W·tan θ/2. Since a desirable value of θ ranges from the critical angle θc (41.8° in case of n=1.5) to 60°, H0/W is calculated. Accordingly, the upper limit of the desirable height of the sealing lens 10 (H in (e) of FIG. 2) is a sum of H0 and a distance between the substrate 25 and the apex 10c of the mortar shape in a case where the apex 10c is made as close as possible to the substrate provided that the apex 10c does not contact the wavelength converting portion 40 (H1 in (e) of FIG. 2).

To be more specific, consideration will be made as to an example which is a case where the one side of the sealing lens 10 is 2.8 mm in length (corresponding to W in (e) of FIG. 2) which was cited as a typical length of the mortar-shaped or funnel-shaped light emitting device 50. There is considered a typical case where the thickness in a substrate-vertical direction of the wavelength converting portion 40 with which the LED chip 25 is coated is 0.3 mm (h1 in (e) of FIG. 2) and a distance between the wavelength converting portion 40 and the apex 10c (h2 in (e) of FIG. 2) is 0.1 mm. In this case, the distance H1 between the substrate 25 and the apex 10c is 0.4 mm. This value is 0.14 times with respect to the width of the sealing lens 10 of 2.8 mm. Accordingly, the upper limit of the desirable height of the sealing lens 10 (H in (c) of FIG. 2) in this typical example is generally 0.6 to 1.1 times with respect to the width of the sealing lens 10.

(Planar Light Source)

Figure 10:
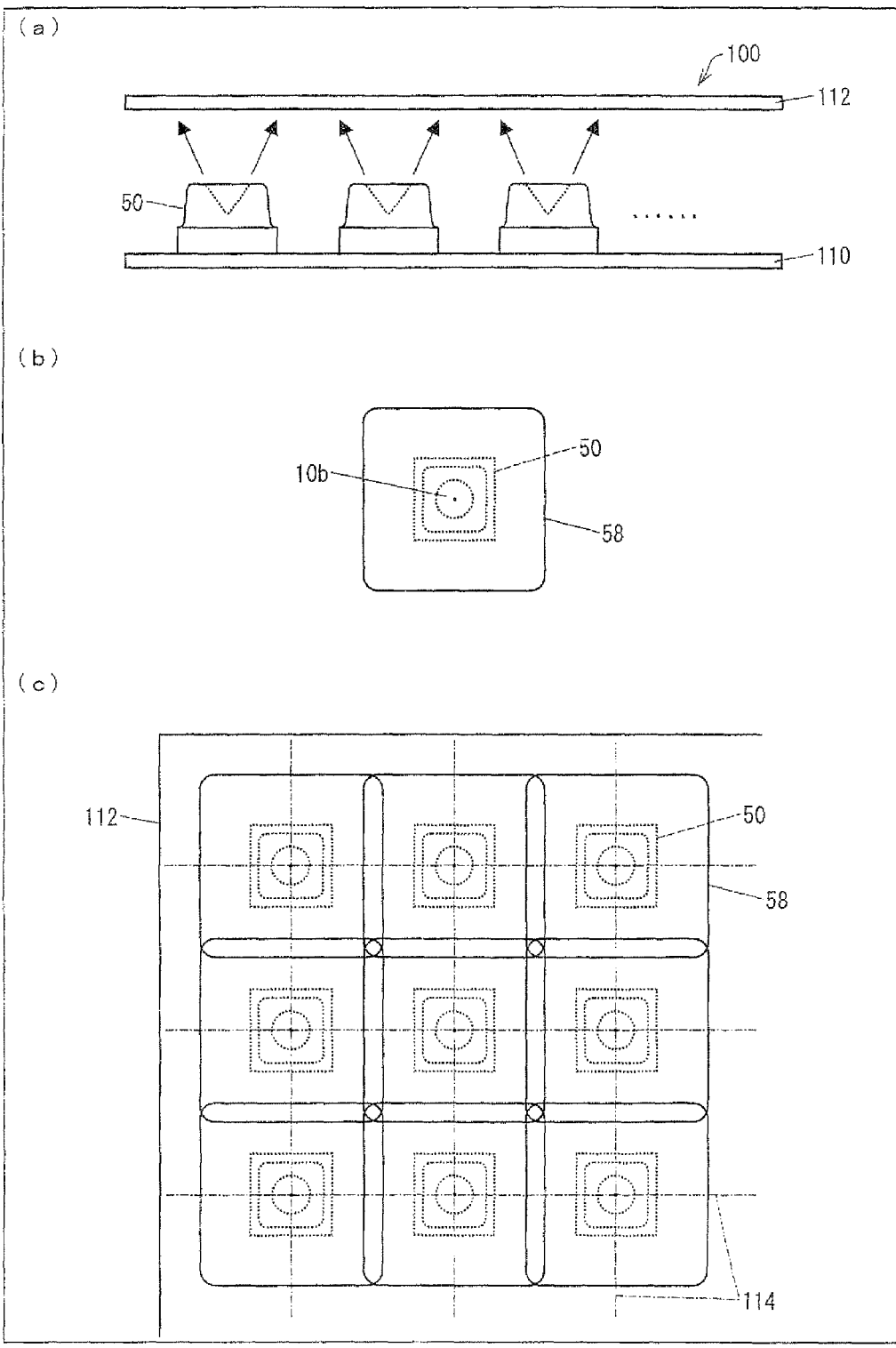
FIG. 10 is a drawing schematically showing a planar light source, an illumination shape of a mortar-shaped or funnel-shaped light emitting device, and a sequence pattern of the mortar-shaped or funnel-shaped light emitting device, in accordance with an embodiment of the present invention. (a) of FIG. 10 is a side view showing the planar light source in accordance with the embodiment. (b) of FIG. 10 is a drawing schematically showing a correspondence between the mortar-shaped or funnel-shaped light emitting device in accordance with the embodiment and an illumination shape. (c) of FIG. 10 is a plan view showing positions of the mortar-shaped or funnel-shaped light emitting devices in accordance with the embodiment and the illumination shapes of the mortar-shaped or funnel-shaped light emitting devices serving as a planar light source.

FIG. 10 is a drawing schematically showing a planar light source 100, an illumination shape of the mortar-shaped or funnel-shaped light emitting device 50, and an sequence pattern of the mortar-shaped or funnel-shaped light emitting device 50, in accordance with Embodiment 1. (a) of FIG. 10 is a side view showing the planar light source 100. As shown in (a) of FIG. 10, the planar light source 100 includes a mounting substrate 110, a plurality of mortar-shaped or funnel-shaped light sources 50 provided on the mounting substrate 110, and a diffusing plate 112 positioned to face the mounting substrate 110. The planar light source 100 is designed such that light emitted from the mortar-shaped or funnel-shaped light emitting device 50 illuminates the diffusing plate 112 from the backside, is diffused by the diffusing plate 112 and is emitted as planar light from the front side of the planar light source 100.

(b) of FIG. 10 is a drawing schematically showing a correspondence between the mortar-shaped or funnel-shaped light emitting device 50 and an illumination shape. The sealing lens 10 of the mortar-shaped or funnel-shaped light emitting device 50 has the mortar-shaped or funnel-shaped gradient 10b at its central portion on a plan view, and the illumination shape 58 of the diffusing plate 112 is substantially a rectangle having angles in diagonal directions of the sealing lens 10.

(c) of FIG. 10 is a plan view showing positions of the mortar-shaped or funnel-shaped light emitting devices 50 and an illumination shape as a planar light source. As shown in (c) of FIG. 10, on the mounting substrate 110, the mortar-shaped or funnel-shaped light emitting devices 50 each having the illumination shape shown in (b) of FIG. 10 are arranged in a square manner. That is, as indicated by chain double-dashed lines in (c) of FIG. 10, lattice points of array axes 114 form angles of squares, and the mortar-shaped or funnel-shaped light emitting devices 50 are positioned to be on individual lattice points. Simply arranging the mortar-shaped or funnel-shaped light emitting devices 50 each having substantially rectangular illumination shape in a square manner enables easily achieving a planar light source having high evenness in luminance in a plane.

Further, the mortar-shaped or funnel-shaped light emitting device 50 has a wider illumination area per one light emitting device than the domed light emitting device 60. Accordingly, in a case where a planar light source is constituted by a plurality of mortar-shaped or funnel-shaped light emitting devices 50, it is possible to reduce the number of light emitting devices to be mounted. Further, light is emitted with a large emission angle, i.e. the emitted light is nearly parallel to the mounting substrate 110. This enables shortening a distance between the mounting substrate 110 and the diffusing plate 112, which is advantageous in producing a thin backlight.

Further, the illumination shape of the mortar-shaped or funnel-shaped light emitting device 50 is substantially a rect-angle, which is very simple compared with the illumination shape of the four-leaved light emitting device 70. Accordingly, in the case of the mortar-shaped or funnel-shaped light emitting device 50, it is unnecessary to arrange individual light emitting devices in a special manner which takes overlapping of bright portions and dark portions of the illumination shape into consideration in order to secure evenness in illuminance in a plane, unlike the four-leaved light emitting device 70.

That is, it is unnecessary to position light emitting devices while rotating the light emitting devices around their main axes in consideration of their illumination shapes and it is not always necessary to position light emitting devices in a zigzag manner. This enables greatly simplifying design and production of a planar light source. Further, this also enables greatly simplifying design and production of a backlight included in a display device based on a later-mentioned area active (local dimming) method.

The light emitting device in accordance with the embodiment of the present invention includes the substrate 20, the LED chip 25 die-bonded to the substrate 20, the wavelength converting portion 40 with which the LED chip 25 is coated, and the lens including at least four planes uprising from the substrate 20 and the top plane 10a facing the substrate 20, the four planes being positioned in four directions, respectively, so as to surround the LED chip 25, and the top plane 10a having a concave portion.

Further, the light emitting device in accordance with the embodiment of the present invention includes the substrate 20, the LED chip 25 die-bonded to the substrate 20, the wavelength converting portion 40 with which the LED chip 25 is coated, the wavelength converting portion 40 doubles as the sealing lens 10 including at least four planes uprising from the substrate 20 and the top plane 10a facing the substrate 20, and the top plane 10a having a concave portion.

With each of the above arrangements, the light emitting device in accordance with the present embodiment is designed such that the wavelength converting portion 40 has the concave portion in its central portion, and accordingly the light emitting device can form a rectangular illumination shape on a view plane parallel to the substrate 20. Therefore, it is possible to provide a light emitting device whose structure is suitable for a display device which do not suffer illumination unevenness and chromaticity unevenness even if the display device is designed to be thin.

Further, since the light emitting device of the present example has a rectangular illumination shape, the light emitting device is preferably applicable to a liquid crystal display device employing an area active (local dimming) method.

Further, in the light emitting device of the present example, the concave portion may be a cone, a truncated cone, a polygonal cone, or a truncated polygonal cone whose apex faces the substrate.

Further, the light emitting device of the present example may be arranged so as to include a plurality of LED chips 25 positioned around the central axis of the cone, the truncated cone, the polygonal cone, or the truncated polygonal cone.

Further, the light emitting device of the present example may be arranged so as to include four LED chips 25 positioned separately from each other and symmetrically with respect to the central axis of the cone, the truncated cone, the polygonal cone, or the truncated polygonal cone.

In the present embodiment, the term "rectangular" or "rectangle" indicates a square or an oblong. Such a rectangle may have curved apexes or curved peripherals. The curve may be a one in which slightly and outwardly concave parts and/or slightly and outwardly convex parts are smoothly bound to each other.

Embodiment 2

The following explains another embodiment of the present invention with reference to FIGS. 11-14. Arrangements other than arrangements explained in the present embodiment are the same as those in Embodiment 1. For convenience of explanation, members having the same functions as those shown in the drawings of Embodiment 1 are given the same reference numerals and explanations thereof are omitted here.

Figure 11:
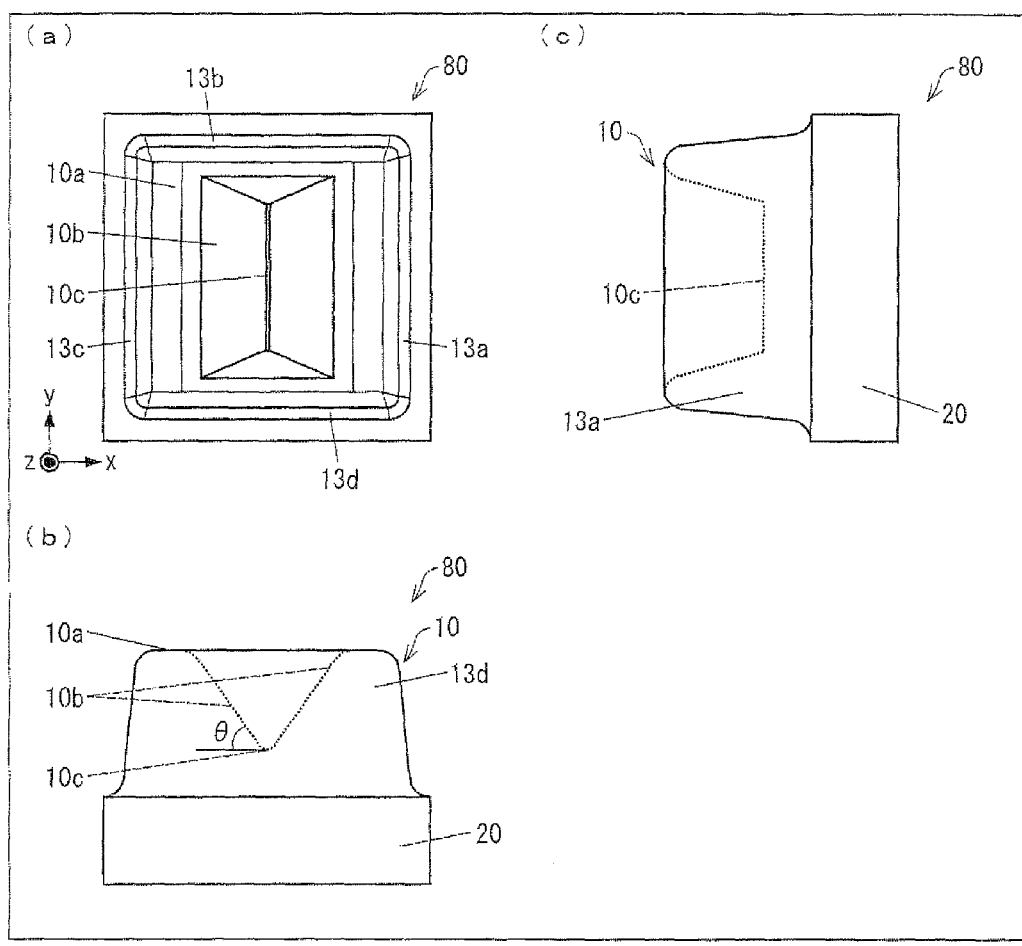
FIG. 11 is an explanatory drawing explaining a wedge-shaped light emitting device in accordance with another embodiment of the present invention. (a) of FIG. 11 is a plan view of the wedge-shaped light emitting device in accordance with another embodiment. (b) of FIG. 11 is an elevation view of the wedge-shaped light emitting device in accordance with another embodiment. (c) of FIG. 11 is a side view of the wedge-shaped light emitting device in accordance with another embodiment.
Figure 12:
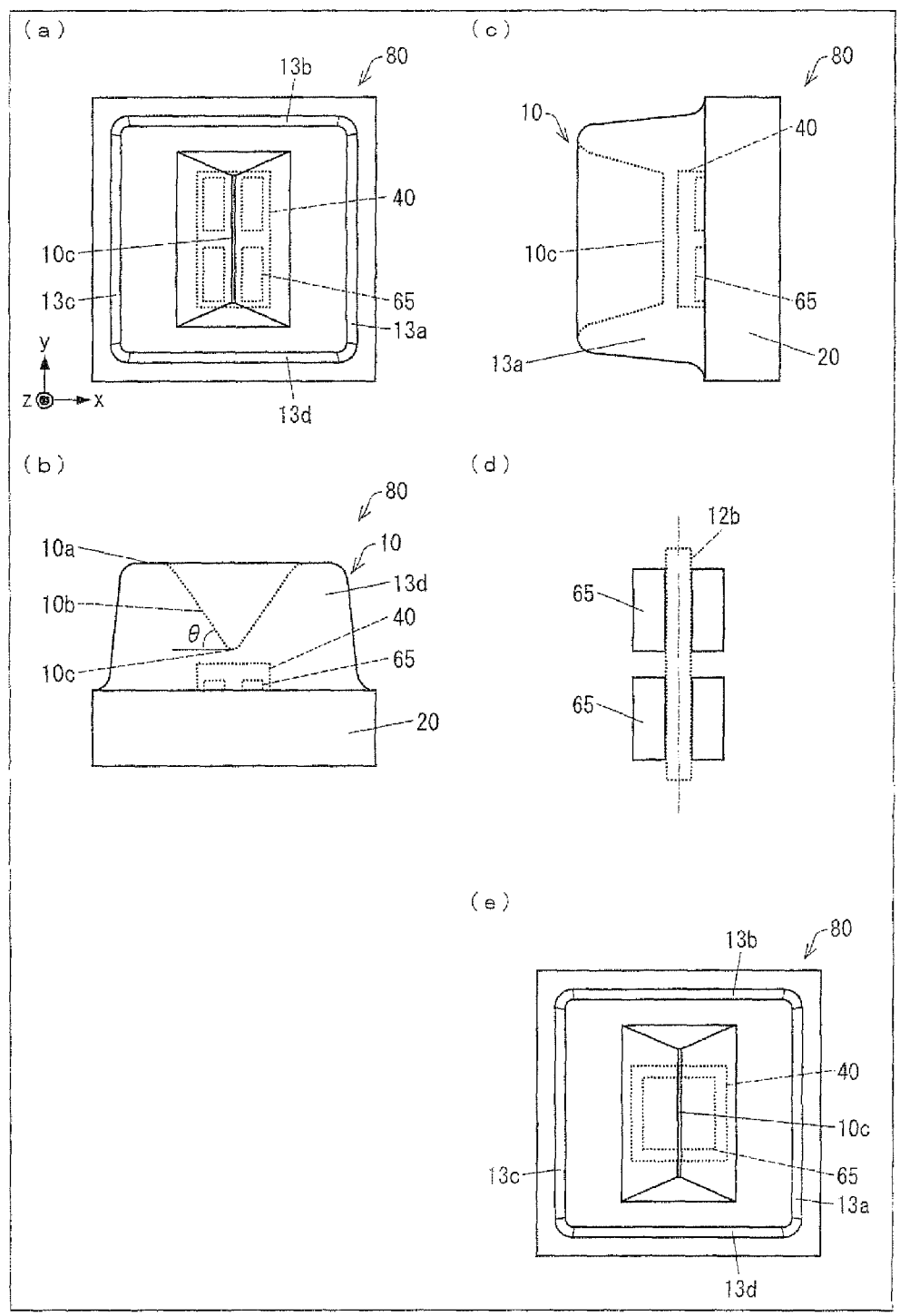
FIG. 12 is an explanatory drawing explaining an internal structure of a wedge-shaped light emitting device in accordance with another embodiment of the present invention. (a) of FIG. 12 is a plan view showing an internal structure of the wedge-shaped light emitting device in accordance with another embodiment. (b) of FIG. 12 is an elevation view showing an internal structure of the wedge-shaped light emitting device in accordance with another embodiment. (c) of FIG. 12 is a side view showing an internal structure of the wedge-shaped light emitting device in accordance with another embodiment. (d) of FIG. 12 is an enlarged view showing a long LED chip and its surroundings in the wedge-shaped light emitting device in accordance with another embodiment. (e) of FIG. 12 is a plan view showing a configuration in which one long LED chip is die-bonded right below a V-shaped apex.
Figure 13:
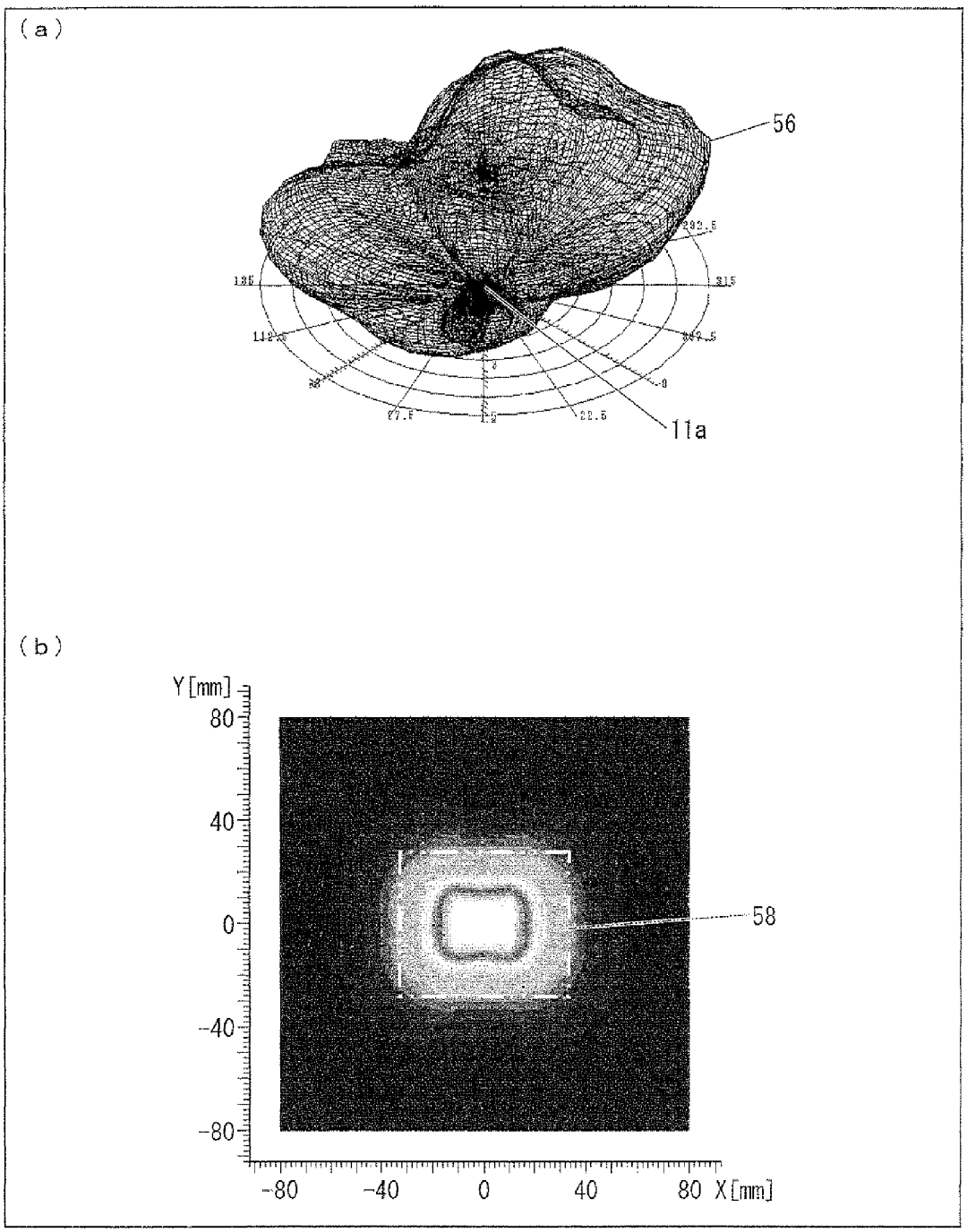
FIG. 13 shows views showing a light distribution property and an illumination shape, respectively, of a wedge-shaped light emitting device in accordance with another embodiment of the present invention. (a) of FIG. 13 is a simulation view three-dimensionally showing a light distribution property of the wedge-shaped light emitting device in accordance with another embodiment. (b) of FIG. 13 is a simulation view showing an illumination shape of the wedge-shaped light emitting device in accordance with another embodiment.

FIG. 11 shows a plan view, an elevation view, and a side view of a wedge-shaped light emitting device 80 in accordance with Embodiment 2. FIG. 12 shows an internal structural view of the wedge-shaped light emitting device 80. FIG. 13 shows views indicating a light distribution property and an illumination shape, respectively, of the wedge-shaped light emitting device 80. The following explains the wedge-shaped light emitting device 80 in accordance with Embodiment 2 in terms of differences from the mortar-shaped or funnel-shaped light emitting device 50 in accordance with Embodiment 1.

(a) of FIG. 11 is a plan view showing the wedge-shaped light emitting device 80 in accordance with Embodiment 2. (b) of FIG. 11 is an elevation view showing the wedge-shaped light emitting device 80 in accordance with Embodiment 2. (c) of FIG. 11 is a side view showing the wedge-shaped light emitting device 80 in accordance with Embodiment 2.

(a) of FIG. 12 is a plan view showing an internal structure of the wedge-shaped light emitting device 80 in accordance with Embodiment 2. (b) of FIG. 12 is an elevation view showing the internal structure of the wedge-shaped light emitting device 80 in accordance with Embodiment 2. (c) of FIG. 12 is a side view showing the wedge-shaped light emitting device 80 in accordance with Embodiment 2. (d) of FIG. 12 is an enlarged view showing a long LED chip 65 and its surroundings in the wedge-shaped light emitting device 80 in accordance with Embodiment 2. (e) of FIG. 12 is a plan view showing a configuration in which one long LED chip 65 is die-bonded right below a V-shaped apex 10c.

An outer characteristic of the wedge-shaped light emitting device 80 is such that a sealing lens 10 is quadrangular on a plan view and a concavity corresponding to the sealing lens 10 is provided at substantially the center of a substrate 20. The concavity resembles a V-shape in its cross section (elevation view). Further, the concavity has a flat bottom taken along a cross section (side view) perpendicular to the V-shaped cross section. The concavity forms a wedge-shaped groove as a whole.

As shown in (a) of FIG. 12, four long LED chips 65 are die-bonded in such a manner that the long LED chips 65 are symmetrical with respect to the V-shaped bottom and long sides of the long LED chips 65 are parallel to the V-shaped groove. That is, the long LED chips 65 are positioned in such a manner that the V-shaped bottom is right above the center of a separating region between the long LED chips 65.

With the configuration, even when a die-bonding position is a little shifted in an x-direction or a y-direction, or even when the position of an apex 10c of the wedge-shaped gradient 10b is a little shifted in an x-direction or a y-direction when forming the sealing lens 10, the position of the V-shaped apex 10c on a plan view is within a separating region 12b for LED chips as shown in (d) of FIG. 12, and the four long LED chips 65 are positioned substantially evenly with respect to the wedge-shaped gradient 10b and the apex 10c. Consequently, the light distribution property of the wedge-shaped light emitting device 80 is stable and highly symmetrical.

An explanation was made above as to a case where four long LED chips 65 are used. However, the shape of a chip is not limited to a long one. Further, the LED chips may be disposed in such a manner that both sides of the V-shaped groove are provided with one LED chip, i.e. two LED chips in total are disposed, or that both sides of the V-shaped groove are provided with three LED chips, i.e. six LED chips in total are disposed. The point is that the LED chips should be positioned symmetrically with respect to the wedge-shaped groove.

As shown in (e) of FIG. 12, one LED chip 25 or a plurality of chips may be die-bonded right below the V-shaped apex 10c. In this case, it is necessary to exactly manage production so that the center of the LED chip 25 is positioned right below the V-shaped apex 10c, thereby distributing light evenly at both sides. Therefore, difficulty in stably producing products with the same light distribution property is higher than the case where four long LED chips 65 are positioned evenly as shown in (a) of FIG. 12.

It is difficult to produce the V-shaped apex 10c ideally due to insufficient accuracy in treatment, and the position of the LEDs 25 shown in (e) of FIG. 12 leads to great leakage of light in an axis direction. Accordingly, in order to realize a stable property in production, it is particularly preferable that the LED chip 25 shown in (a) of FIG. 12 is shifted from the apex 10c.

FIG. 13 shows a light distribution property and an illumination shape of the wedge-shaped light emitting device in accordance with Embodiment 2. (a) of FIG. 13 is a simulation view three-dimensionally showing a light distribution property of the wedge-shaped light emitting device 80 in accordance with Embodiment 2. The distance between a center 11a and an outer plane 56 indicates intensity of emitted light. (b) of FIG. 13 is a simulation view showing an illumination shape of the wedge-shaped light emitting device 80 in accordance with Embodiment 2.

The illumination shape used herein is a one when the diffusing plate 112 is illuminated. In the drawing, the chain double-dashed line indicates a contour 58. As seen from the drawing, the illumination shape of the wedge-shaped light emitting device 80 is substantially rectangular and substantially an oblong formed on the diffusing plate 112.

It is desirable that an angle θ of inclination on the wedge-shaped gradient 10b ranges generally from a critical angle θe of total reflection to 60°.

(Planar Light Source)

Figure 14:
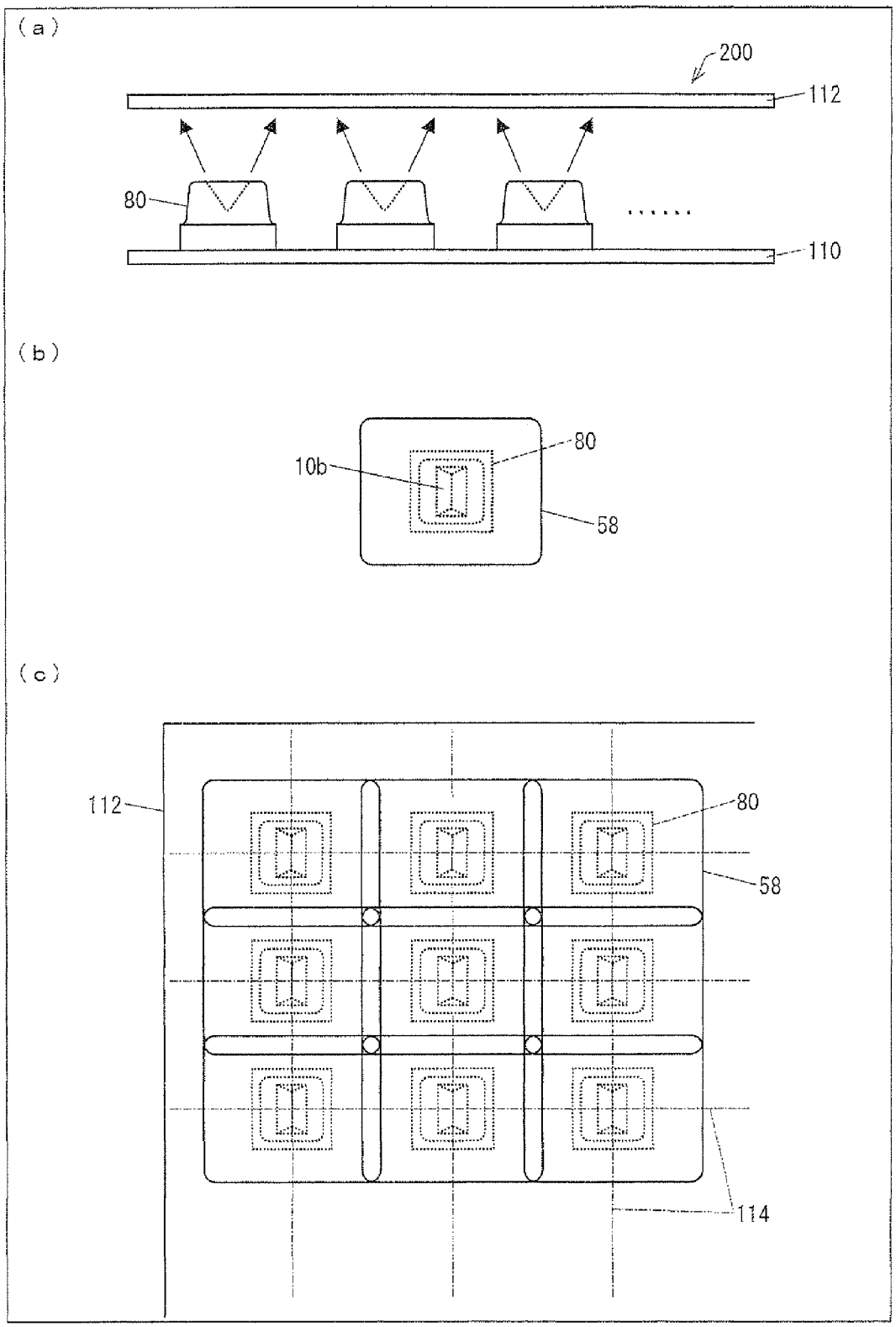
FIG. 14 shows a schematic view of a planar light source and a view of a sequence pattern of a wedge-shaped light emitting device, in accordance with another embodiment. (a) of FIG. 14 is a side view of the planar light source in accordance with another embodiment. (b) of FIG. 14 is a schematic view showing a correspondence between the wedge-shaped light emitting device in accordance with another embodiment and an illumination shape. (c) of FIG. 14 is a plan view showing the positions of the wedge-shaped light emitting devices and the illumination shapes of the wedge-shaped light emitting devices serving as a planar light source.

FIG. 14 shows a schematic view of a planar light source 200 and a view of a sequence pattern of a wedge-shaped light emitting device, in accordance with Embodiment 2. (a) of FIG. 14 is a side view of the planar light source 200. (b) of FIG. 14 is a schematic view showing a correspondence between the wedge-shaped light emitting device 80 and the illumination shape. (c) of FIG. 14 is a plan view showing the positions of the wedge-shaped light emitting device 80 and the illumination shapes of the wedge-shaped light emitting devices 80 serving as a planar light source.

As shown in (b) of FIG. 6, in the mortar-shaped or funnel-shaped light emitting device 50, the illumination shape is substantially rectangular and square, and as shown in (c) of FIG. 10, by merely positioning the sequence pattern of the mortar-shaped or funnel-shaped light emitting device 50 in a square manner, it was possible to easily obtain a planar light source having high evenness in illuminance in a plane.

The substantial rectangle (rectangular shape) includes a one whose corners and peripheries are rounded. The curve may be a one in which slightly and outwardly concave parts and/or slightly and outwardly convex parts are smoothly bound to each other.

In contrast thereto, the illumination shape of the wedge-shaped light emitting device 80 shown in (b) of FIG. 13 is substantially rectangular but substantially an oblong, and it is necessary to change the sequence pattern of the wedge-shaped light emitting device 80 as shown in FIG. 14. That is, only by rectangularly arranging the wedge-shaped light emitting devices 80 in consideration of the illumination shape, it is possible to easily realize a planar light source having high evenness in illuminance in a plane.

The wedge-shaped light emitting device 80 in accordance with the present embodiment may be arranged such that the concave portion is a wedge-shaped groove whose apex faces the substrate and the groove resembles a V-shape in its cross section.

The light emitting device 80 may be arranged such that there are provided a plurality of the long LED chips 65 which are positioned at peripheries of a plane which faces the wedge-shaped groove and which is positioned below a bottom of the V-shape.

Further, the light emitting device 80 may be arranged such that the plurality of the long LED chips 65 are two or a multiple of two long LED chips 65 which are positioned at the peripheries of the plane which faces the wedge-shaped groove in such a manner that the two or the multiple of two long LED chips 65 are separated from each other and symmetrical to each other.

Embodiment 3

Figure 15:
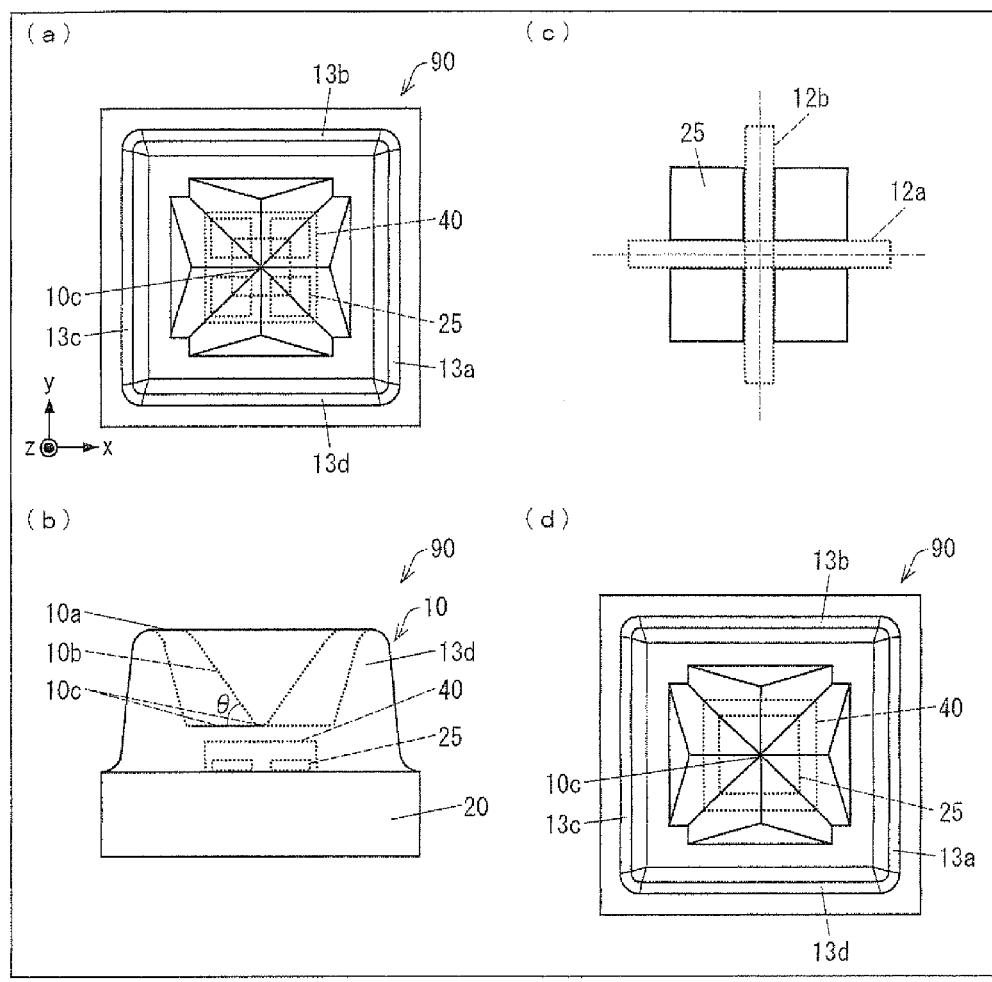
FIG. 15 is an explanatory drawing explaining a light emitting device in accordance with still another embodiment of the present invention. (a) of FIG. 15 is a plan view showing an internal structure of the light emitting device in accordance with still another embodiment. (b) of FIG. 12 is an elevation view showing an internal structure of the light emitting device in accordance with still another embodiment. (c) of FIG. 12 is an enlarged view showing an LED chip and its surroundings in the wedge-shaped light emitting device in accordance with still another embodiment. (d) of FIG. 12 is a plan view showing a configuration in which one LED chip is die-bonded right below a V-shaped apex.
Figure 16:
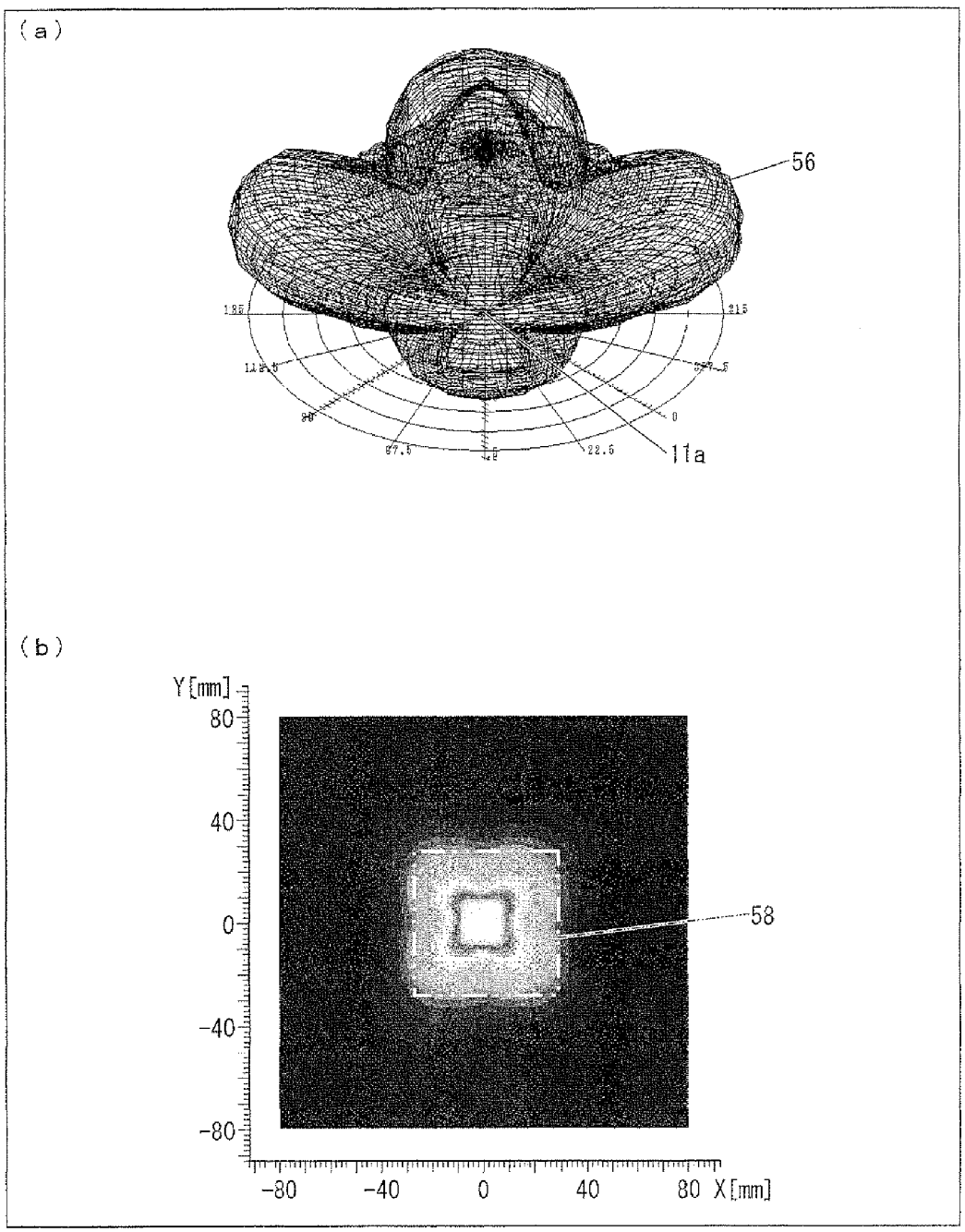
FIG. 16 shows an illumination shape of a light emitting device in accordance with still another embodiment of the present invention. (a) of FIG. 16 is a simulation view three-dimensionally showing a light distribution property of the light emitting device in accordance with still another embodiment. (b) of FIG. 16 is a simulation view showing the illumination shape of the light emitting device in accordance with still another embodiment.

The following explains another embodiment of the present invention with reference to FIGS. 15 and 16. Arrangements other than arrangements explained in the present embodiment are the same as those in Embodiments 1 and 2. For convenience of explanation, members having the same functions as those shown in the drawings of Embodiments 1 and 2 are given the same reference numerals and explanations thereof are omitted here.

FIG. 15 shows plan views and an elevation view of a light emitting device 90 in accordance with Embodiment 3. FIG. 16 shows illumination shapes in Embodiment 3.

(a) of FIG. 15 is a plan view of the light emitting device 90 in accordance with Embodiment 3. (b) of FIG. 15 is an elevation view of the light emitting device 90 in accordance with Embodiment 3. (c) of FIG. 15 is an enlarged view of an LED chip and its surroundings in the light emitting device 90 in accordance with Embodiment 3. (d) of FIG. 15 is a plan view showing a configuration in which one LED chip is die-bonded right below a V-shaped apex in the light emitting device 90 in accordance with Embodiment 3.

The appearance of the light emitting device 90 is different from that of the wedge-shaped light emitting device in accordance with Embodiment 2 in that the light emitting device 90 has a concavity at the central part of the sealing lens 10. The concavity in the light emitting device 90 is designed as if the concavities of the wedge-shaped light emitting device 80 in accordance with Embodiment 2 cross each other.

As shown in (a) of FIG. 15, four LED chips 25 are die-bonded in such a manner that they are symmetrical with respect to the V-shaped bottom. Further, the LED chips 25 are positioned in such a manner that the crossing concavities are positioned right above the centers of the separating regions 12a and 12b for the LED chips 25.

With the arrangement, even if the die-bonding position is a little shifted in an x-direction or y-direction, and even if the position of an apex 10c of a wedge-shaped gradient 10b is a little shifted in an x-direction or y-direction, when seen on a plan view, the V-shaped apex 10c is positioned to be within the separating regions 12a and 12b for the LED chips in (c) of FIG. 15, and the four LED chips 25 are positioned substantially evenly in four directions with respect to the wedge-shaped gradient 10b. Consequently, a light distribution property of the light emitting device 90 in accordance with Embodiment 3 is stable and highly symmetrical.

As shown in (d) of FIG. 15, only one LED chip 25 may be die-bonded at the central part of the crossing concavities or a plurality of chips may be die-bonded right under the V-shaped apex 10c. In this case, it is essential to strictly manage production so that the center of the LED chip 25 is right below the V-shaped apex 10c, thereby distributing light evenly in all directions. Consequently, difficulty in stably producing products with the same light distribution property is higher than a case where the four LED chips 25 are positioned evenly as in (a) of FIG. 15.

In consideration of insufficient accuracy in processing the V-shaped apex 10c, it is particularly preferable to arrange the LED chips 25 in such a manner that they are shifted from the apex 10c as shown in (a) of FIG. 15 in order to realize a stable property in production.

As with Embodiment 2, it is desirable that an inclination angle θ of the wedge-shaped gradient 10b ranges generally from a critical angle θc of total reflection to 60°.

FIG. 16 shows simulation views of the illumination shape of the light emitting device 90 in accordance with Embodiment 3. (a) of FIG. 16 is a simulation view three-dimensionally showing a light distribution property of the light emitting device 90 in accordance with Embodiment 3. (b) of FIG. 16 is a simulation view showing the illumination shape of the light emitting device 90 in accordance with Embodiment 3.

As shown in (b) of FIG. 16, the light emitting device 90 forms substantially a rectangular and square illumination shape on the diffusing plate 112. Thus, a planar light source which have high evenness in illuminance in a plane can be easily obtained by arranging LED chips in a square manner, as in the case of the mortar-shaped or funnel-shaped light emitting device 50 which forms a similar illumination shape. The substantial rectangle (rectangular shape) includes a one whose corners and peripheries are rounded. The curve may be a one in which slightly and outwardly concave parts and/or slightly and outwardly convex parts are smoothly bound to each other.

The light emitting device 90 in accordance with the present embodiment may be arranged such that a concave portion is made of two crossing grooves each of which has a wedge shape and has an apex facing a substrate, and the groove resembles a V-shape in its cross section.

Further, The light emitting device 90 may be arranged such that there are provided a plurality of the LED chips 25 which are positioned to face a plane facing the wedge-shaped groove.

Further, the light emitting device 90 may be arranged such that the plurality of the LED chips 25 are four LED chips 25 which are positioned in such a manner that when seen from a top surface 10a, separating portions for the LED chips 25 die-bonded on the substrate correspond to apex portions of the V-shaped groove.

Embodiment 4

Figure 17:
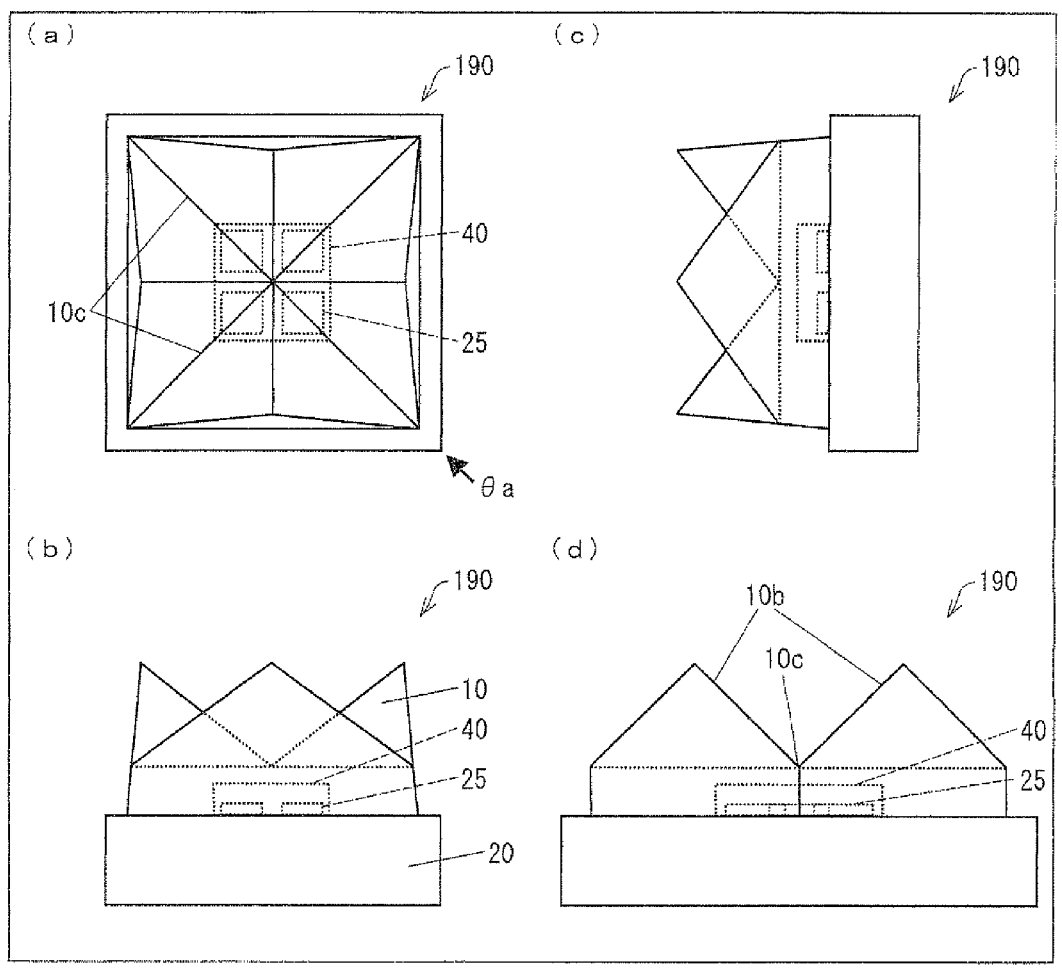
FIG. 17 shows explanatory drawings for explaining a light emitting device in accordance with still another embodiment of the present invention. (a) of FIG. 17 is a plan view of the light emitting device in accordance with the embodiment. (b) of FIG. 17 is an elevation view of the light emitting device in accordance with the embodiment. (c) of FIG. 17 is a side view of the light emitting device in accordance with the embodiment. (d) of FIG. 17 is a side view of the light emitting device in accordance with the embodiment seen from an oblique 45° direction (ea direction).

The following explains another embodiment of the present invention with reference to FIGS. 17 and 18. Arrangements other than arrangements explained in the present embodiment are the same as those in Embodiments 1 to 3. For convenience of explanation, members having the same functions as those shown in the drawings of Embodiments 1 to 3 are given the same reference numerals and explanations thereof are omitted here.

FIG. 17 shows explanatory drawings for explaining a light emitting device 190 in accordance with Embodiment 4. (a) of FIG. 17 is a plan view of the light emitting device 190 in accordance with Embodiment 4. (b) of FIG. 17 is an elevation view of the light emitting device 190 in accordance with Embodiment 4. (c) of FIG. 17 is a side view of the light emitting device 190 in accordance with Embodiment 4. (d) of FIG. 17 is a side view of the light emitting device 190 in accordance with Embodiment 4 seen from an oblique 45° direction (θa direction).

FIG. 18 shows drawings of the illumination shape of the light emitting device 190 in accordance with Embodiment 4. (a) of FIG. 18 is a simulation view three-dimensionally showing a light distribution property of the light emitting device 190 in accordance with Embodiment 4. (b) of FIG. 18 is a simulation view showing the illumination shape of the light emitting device 190 in accordance with Embodiment 4.

The appearance of the light emitting device 190 is different from that of the light emitting device 90 in accordance with Embodiment 3 in that crossing V-shaped grooves on a sealing lens 10 run in diagonal directions as shown in FIG. 17, and each V-shaped groove extends from one angle to its opposite angle.

The light emitting device 190 having such a shape can form a substantially rectangular and square shape on a diffusing plate 112 as shown in FIG. 18. Thus, a planar light source which has high evenness in illuminance in a plane can be easily obtained by arranging LED chips in a square manner, as in the case of the mortar-shaped or funnel-shaped light emitting device 50 which forms a similar illumination shape. The substantial rectangle (rectangular shape) includes a one whose corners and peripheries are rounded. The curve may be a one in which slightly and outwardly concave parts and/or slightly and outwardly convex parts are smoothly bound to each other.

The light emitting device in accordance with the present embodiment includes: the substrate 20; the LED chip 25 die-bonded to the substrate 20; and the wavelength converting portion 40 covering the LED chip 25, the wavelength converting portion 40 including four planes uprising from the substrate 20, the four planes being positioned in four directions, respectively, in such a manner as to surround the wavelength converting portion 40, a ceiling of the wavelength converting portion 40 which faces the substrate 20 being designed such that two wedge-shaped grooves each having an apex facing the substrate 20 extend from one of four lines of intersection of the four planes to diagonally opposite one of the four lines while the two wedge-shaped grooves cross each other.

With the arrangement, the light emitting device 190 is designed such that the two wedge-shaped grooves extend from one of four lines of intersection of the four planes to diagonally opposite one of the four lines while the two wedge-shaped grooves cross each other, and accordingly emission of light from the light emitting device 190 forms a rectangular illumination shape on a view plane parallel to the substrate 20. This allows providing a light emitting device having a structure suitable for a thin display device with little unevenness in illuminance and chromaticity.

The light emitting device 190 may include, in the sealing material, an LED package (wavelength converting portion) 40 for absorbing primary light emitted from the semiconductor light emitting element and emitting secondary light.

Embodiment 5

The following explains another embodiment of the present invention with reference to FIG. 19. Arrangements other than arrangements explained in the present embodiment are the same as those in Embodiments 1 to 4. For convenience of explanation, members having the same functions as those shown in the drawings of Embodiments 1 to 4 are given the same reference numerals and explanations thereof are omitted here.

FIG. 19 schematically shows a liquid crystal display device 500 (display device) based on an area active (local dimming) method. (a) of FIG. 19 is a plan view of the liquid crystal display device 500 based on an area active (local dimming) method. (b) of FIG. 19 is a transverse sectional view of the liquid crystal display device 500 based on an area active (local dimming) method taken along an A-A' line of (a) of FIG. 19.

The liquid crystal display device 500 based on an area active (local dimming) method includes a liquid crystal display panel (hereinafter referred to as display panel) 510 and the planar light source 100 described in Embodiment 1 as a backlight for illuminating the display panel 510 from the backside.

The display panel 510 is divided into a plurality of regions, and the planar light source 100 is divided into a plurality of regions corresponding to the plurality of regions of the display panel 510. Each of the plurality of regions of the planar light source 100 is capable of being driven independently from each other. Further, the planar light source 100 is driven by a driver (not shown) capable of regulating illuminance in accordance with an image displayed by the display panel 510. The planar light source 100 selectively illuminates the display panel 510 in such a manner that a high-illuminance part of the displayed image is strongly illuminated from the backside and a low-illuminance part of the displayed image is weakly illuminated from the backside. This enables reducing power consumption and increasing contrast.

(c) of FIG. 19 and (d) of FIG. 19 are views showing a positional relationship between the divided regions of the display panel 510 and the divided regions of the planar light source 100. For example, assume that the display panel 510 displays an image of an exit 512 of a tunnel viewed in a traveling direction from a train running in the tunnel. In this case, the exit 512 of the tunnel is displayed brightly in the dark. A region of the display panel 510 where the exit 512 of the tunnel is displayed is referred to as a segment 510a and a region of the planar light source 100 which faces the backside of the segment 510a is referred to as a segment 100a. In the case of displaying such an image, luminance of the segment 100a which faces the backside of the segment 510a is increased.

In Embodiment 5, the illumination shape of each mortar-shaped or funnel-shaped light emitting device 50 provided on the mounting substrate 110 has substantially a rectangular shape, and illuminates a limited region having substantially a square shape, and light is hardly diffused to regions other than the square region. Consequently, a crosstalk, i.e. leakage of light into adjacent segments, is prevented. Accordingly, the planar light source including the mortar-shaped or funnel-shaped light emitting devices 50 can be preferably used as a backlight of a display device based on an area active (local dimming) method.

The planar light source is not limited to a one described in Embodiment 1, and may be a one described in Embodiment 2, 3, or 4. Further, the display device is not limited to a liquid crystal display device and may be any display device as long as it can change transmittance of light with respect to each of a plurality of regions.

The planar light source of the present invention includes: a mounting substrate; and a plurality of the light emitting devices as mentioned above, the plurality of the light emitting devices being arranged on the mounting substrate in such a manner that sides of rectangular illumination shapes of the plurality of the light emitting devices are parallel to each other. This enables providing a planar light source having a structure suitable for a thin display device with little unevenness in illuminance and chromaticity.

The display device of the present invention includes: the planar light source; and a display panel capable of changing transmittance of light with respect to each of a plurality of regions, the display panel being illuminated by the planar light source from a backside of the display panel. This enables providing a display device having a structure suitable for a thin display device with little unevenness in illuminance and chromaticity.

The present invention is not limited to the above embodiments. For example, although the sealing resin used in the above explanation has substantially a square shape on a plan view, a sealing resin having an oblong shape is also encompassed in the scope of the claims. That is, the present invention may be altered by a skilled person within the scope of the claims. An embodiment based on a proper combination of technical means disclosed in different embodiments is encompassed in the technical scope of the present invention.

Additional Example 1

The following explains a modification example of Embodiment 1 shown in (a)-(d) of FIG. 2 and (a)-(d) of FIG. 4.

The present modification example is different from Embodiment 1 in that the substrate 20 is oblong, the opening of the mortar-shaped or funnel-shaped gradient 10*b* (portion where the top surface 10*a* and the gradient 10*b* abut each other) has an oval or elliptic shape extending along a longitudinal direction of the substrate 20 on a plan view, and the outline of the wavelength converting portion 40 has an oval shape positioned to be within the opening on a plan view.

FIG. 21 shows top views and side views of the present light emitting device in a case where the present light emitting device has an elliptic opening.

Additional Example 2

Figure 22:
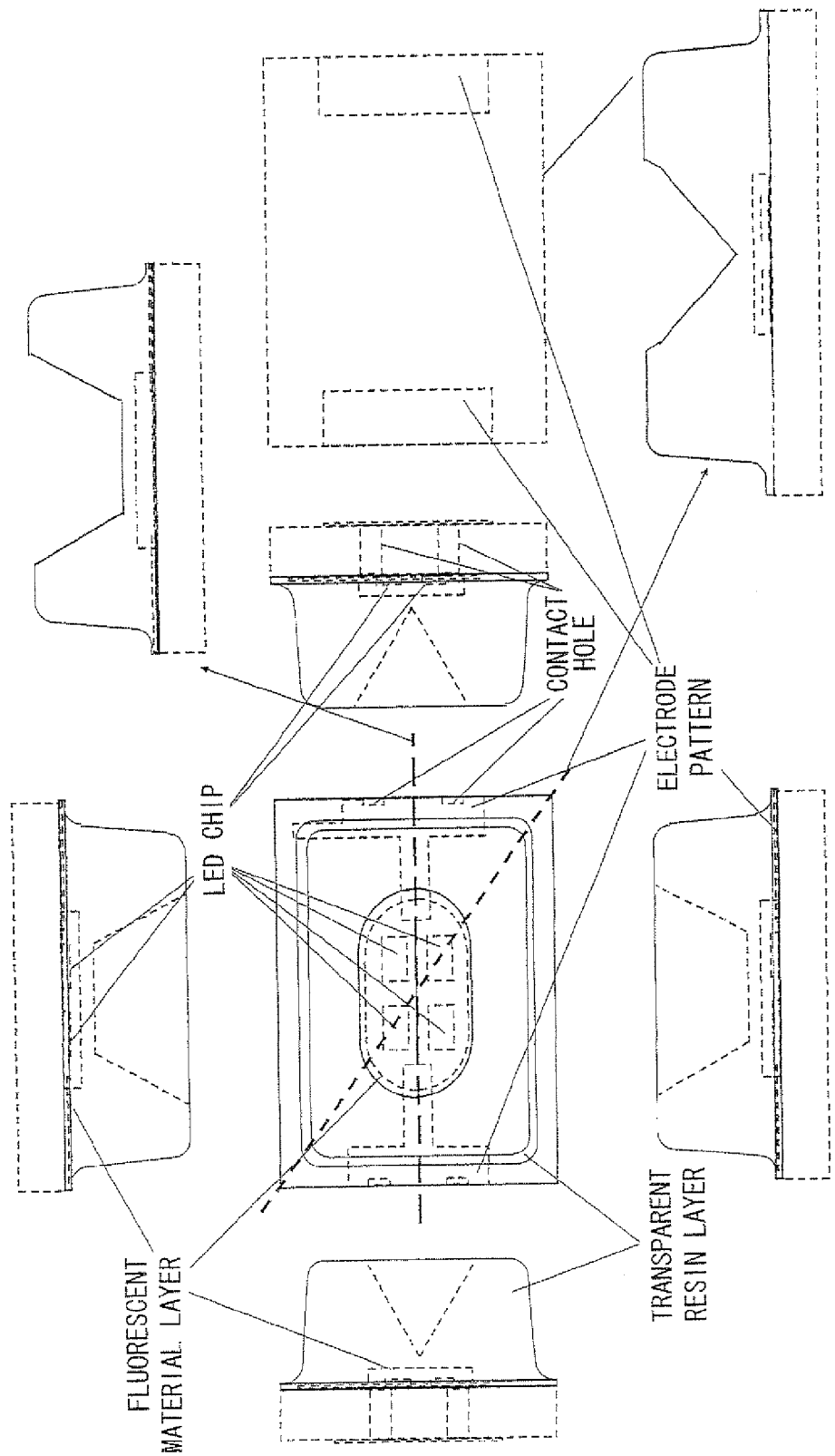
FIG. 22 shows top views and side views of a light emitting device in accordance with Additional Example 2.

FIG. 22 shows top views and side views of the present light emitting device.

The present example is a modification example of Embodiment 2 shown in (a)-(d) of FIG. 12.

In the present example as well as in Additional Example 1, the substrate 20 is oblong, the opening of the mortar-shaped or funnel-shaped gradient (portion where the top surface 10*a* and the gradient 10*b* abut each other) has an oval or elliptic shape extending along a longitudinal direction of the substrate 20 on a plan view, and the outline of the wavelength converting portion 40 has an oval shape positioned to be within the opening on a plan view. Besides, in the present example, both ends of the mortar-shaped or funnel-shaped gradient are each shaped as if it is a half of an inverted cone.

In the above examples, an explanation was made as to light emitting devices whose illumination shape is square or oblong on a view plane parallel to the substrate and as to a planar light source including the light emitting devices. However, the illumination shape may be any shape as long as a light emitting pattern having the shape can fill a plane with as little space as possible. Examples of such a shape include a hexagon and a pentagon.

Summary of Embodiments

The light emitting devices 50 and 121-123 may be arranged such that the lens is a sealing material which seals the LED chip 25.

The light emitting devices 50 and 121-123 may be arranged so as to further include the wavelength converting portion 40 between the LED chip 25 and the lens, the wavelength converting portion 40 covering the LED chip 25 and being made of a resin layer in which a fluorescent material that absorbs primary light from the LED chip 25 and emits secondary light has been dispersed in advance.

The light emitting devices 50 and 121-123 may be arranged such that the concave portion is a conical one, a truncated cone, a polygonal cone, or a truncated polygonal cone whose apexes face the substrate.

The light emitting devices 50 and 121-123 may be arranged such that there are provided a plurality of the LED chips 25 which are positioned to surround a central axis of the concave portion.

The light emitting device 50 may be arranged such that the plurality of semiconductor light emitting elements are four semiconductor light emitting elements which are positioned separately from each other and symmetrically with respect to a central axis of the concave portion.

The light emitting device 80 may be arranged such that the concave portion is a wedge-shaped groove whose apex faces the substrate, and the wedge-shaped groove resembles a V-shape in its cross section.

The light emitting device 80 may be arranged such that there are provided a plurality of the long LED chips 65 which are positioned at peripheries of a plane which faces the wedge-shaped groove and which is positioned below a bottom of the V-shape.

The light emitting device 80 may be arranged such that the plurality of the long LED chips 65 are two or a multiple of two long LED chips 65 which are positioned at the peripheries of the plane which faces the wedge-shaped groove in such a manner that the two or the multiple of two long LED chips 65 are separated from each other and symmetrical to each other.

The light emitting devices 90 and 190 may be arranged such that the concave portion consists of two crossing grooves, each of which has an apex facing the substrate, has a wedge-shaped outline, and resembles a V-shape in its cross section.

The light emitting devices 90 and 190 may be arranged such that there are provided a plurality of the LED chips 25 which are positioned to face a plane facing the wedge-shaped groove.

The light emitting devices 90 and 190 may be arranged such that the plurality of the LED chips 25 are four LED chips 25 which are positioned in such a manner that when seen from the ceiling surface of the sealing lens 10, a separating region provided when the four LED chips 25 are die-bonded to the substrate 20 corresponds to an apex portion of the V-shaped groove.

The mortar-shaped or funnel-shaped light emitting devices 50 and 121-123, the wedge-shaped light emitting device 80, and the light emitting devices 90 and 190 may be arranged so as to further include the wavelength converting portion 40 which covers the LED chip 25 or the long LED chip 65 and is made of a resin layer in which a fluorescent material that absorbs primary light from the LED chip 25 or the long LED chip 65 and emits secondary light has been dispersed in advance.

The planar light sources 100 and 200 in accordance with the present embodiments include: the mounting substrate 110; and a plurality of the light emitting devices as mentioned above, the plurality of the light emitting devices being arranged on the mounting substrate 110.

In a case where the planar light sources 100 and 200 are capable of regulating illuminance with respect to each of a plurality of regions, the liquid crystal display device 500 regulates brightness with respect to each of a plurality of regions according to a displayed image. This enables reducing power consumption.

It is preferable to arrange the liquid crystal display device 500 such that the light emitting devices which emit light to form on the mounting substrate 110 illumination shapes which are rectangles whose corners are rounded are arranged in a square array or an oblong array on the mounting substrate 110.

It is preferable to arrange the liquid crystal display device 500 such that each of the light emitting devices is one of the mortar-shaped or funnel-shaped light emitting devices 50 and 121-123, the wedge-shaped light emitting device 80, and the light emitting devices 90 and 190.

INDUSTRIAL APPLICABILITY

The present invention can be used as a backlight source for illuminating a liquid crystal display panel from its backside. Further, the present invention can be used as a backlight source suitable for a liquid crystal display device based on an area active (local dimming) method. Besides, the present invention is applicable to lighting equipment.

REFERENCE SIGNS LIST 10, 61, 71: sealing lens (lens, sealing material)
10a: top surface (ceiling surface)
10b: gradient
10c: apex
11: main axis
11a: center
12: intersection point
12a, 12b: separating region
12c: central separating region
13a, 13b, 13c, 13d: side surface
20: substrate
24: virtual square
25: LED chip (semiconductor light emitting element)
40: wavelength converting portion
52: bright portion
56: outer surface
60: domed light emitting device
65: long LED chip (semiconductor light emitting element)
70: four-leaved light emitting device
72: bright portion
74: dark portion
58, 78: contour
80: wedge-shaped light emitting device
80a: mountainous portion
80b: valley portion
81a: center
90, 190: light emitting device
100, 200: planar light source
100a, 510a: segment
110: mounting substrate
112: diffusing plate
114: sequence axis
50, 121-123: mortar-shaped or funnel-shaped light emitting device
500: liquid crystal display device
512: exit
d: distance
θ: inclination angle
θc: critical angle

The invention claimed is:

1. A light emitting device, comprising:
a substrate;
at least one semiconductor light emitting element die-bonded to the substrate; and
a lens covering said at least one semiconductor light emitting element,
the lens including four planes uprising from the substrate and a lens having a ceiling surface facing the substrate,
the four planes being positioned in four directions, respectively, in such a manner as to surround said at least one semiconductor light emitting element,
the ceiling surface having a concave portion, and
emission of light from the light emitting device forming, on a view plane parallel to the substrate, a contour of an illumination shape which is a rectangle whose corners are rounded.

2. The light emitting device as set forth in claim 1, wherein the lens is a sealing material which seals said at least one semiconductor light emitting element.

3. The light emitting device as set forth in claim 1, further comprising a wavelength converting portion between said at least one semiconductor light emitting element and the lens, the wavelength converting portion covering said at least one semiconductor light emitting element and being made of a resin layer in which a fluorescent material that absorbs primary light from said at least one semiconductor light emitting element and emits secondary light has been dispersed in advance.

4. The light emitting device as set forth in claim 1, wherein the concave portion is a conical one, a truncated cone, a polygonal cone, or a truncated polygonal cone whose apexes face the substrate.

5. The light emitting device as set forth in claim 1, wherein said at least one semiconductor light emitting element includes a plurality of semiconductor light emitting elements which are positioned to surround a central axis of the concave portion.

6. The light emitting device as set forth in claim 5, wherein the plurality of semiconductor light emitting elements are four semiconductor light emitting elements which are positioned separately from each other and symmetrically with respect to a central axis of the concave portion.

7. The light emitting device as set forth in claim 1, wherein the concave portion is a wedge-shaped groove whose apex faces the substrate, and the wedge-shaped groove resembles a V-shape in its cross section.

8. The light emitting device as set forth in claim 7, wherein said at least one semiconductor light emitting element includes a plurality of semiconductor light emitting elements which are positioned at peripheries of a plane which faces the wedge-shaped groove and which is positioned below a bottom of the V-shape.

9. The light emitting device as set forth in claim 8, wherein the plurality of semiconductor light emitting elements are two or a multiple of two semiconductor light emitting elements which are positioned at the peripheries of the plane which faces the wedge-shaped groove in such a manner that the two or the multiple of two semiconductor light emitting elements are separated from each other and symmetrical to each other.

10. The light emitting device as set forth in claim 1, wherein the concave portion consists of two crossing grooves, each of which has an apex facing the substrate, has a wedge-shaped outline, and resembles a V-shape in its cross section.

11. The light emitting device as set forth in claim 10, wherein said at least one semiconductor light emitting element includes a plurality of semiconductor light emitting elements which are positioned to face a plane facing the wedge-shaped groove.

12. The light emitting device as set forth in claim 11, wherein said at least one semiconductor light emitting element includes four semiconductor light emitting elements which are positioned in such a manner that when seen from the ceiling surface of the lens, a separating region provided when the four semiconductor light emitting elements are die-bonded to the substrate corresponds to an apex portion of the V-shaped groove.

13. A light emitting device, comprising:
a substrate;
at least one semiconductor light emitting element die-bonded to the substrate; and
a lens covering said at least one semiconductor light emitting element,
the lens including four planes uprising from the substrate,
the four planes being positioned in four directions, respectively, in such a manner as to surround the lens,
a ceiling of the lens which faces the substrate being designed such that two wedge-shaped grooves each having an apex facing the substrate extend from one of four lines of intersection of the four planes to diagonally opposite one of the four lines while the two wedge-shaped grooves cross each other, and
light from the light emitting device forming, on a view plane parallel to the substrate, a contour of an illumination shape which is a rectangle whose corners are rounded.

14. The light emitting device as set forth in claim 13, further comprising a wavelength converting portion which covers said at least one semiconductor light emitting element and is made of a resin layer in which a fluorescent material that absorbs primary light from said at least one semiconductor light emitting element and emits secondary light has been dispersed in advance.

15. A planar light source, comprising:
a mounting substrate; and
a plurality of light emitting devices, each comprising:
a substrate;
at least one semiconductor light emitting element die-bonded to the substrate; and
a lens covering said at least one semiconductor light emitting element,
the lens including four planes uprising from the substrate and a lens having a ceiling surface facing the substrate,
the four planes being positioned in four directions, respectively, in such a manner as to surround said at least one semiconductor light emitting element,
the ceiling surface having a concave portion, and
emission of light from the light emitting device forming, on a view plane parallel to the substrate, a contour of an illumination shape which is a rectangle whose corners are rounded,
the plurality of light emitting devices being arranged on the mounting substrate.

16. A display device, comprising:
a planar light source including a mounting substrate and a plurality of light emitting devices on the mounting substrate, an illumination shape of each of the light emitting devices being a rectangle whose corners are rounded; and
a display panel capable of changing transmittance of light with respect to each of a plurality of regions, the display panel being illuminated by the planar light source from a backside of the display panel,
the planar light source forming, on the display panel, a planar illumination shape derived from overlapping of the illumination shapes of the plurality of light emitting devices.

17. The display device as set forth in claim 16, wherein the planar light source is capable of regulating illuminance with respect to each of a plurality of regions.

18. The display device as set forth in claim 16, wherein the light emitting devices are arranged in a square array or an oblong array on the mounting substrate.

19. The display device as set forth in any one of claims 16-18, wherein each of the light emitting devices is a light emitting device, comprising:
a substrate;
at least one semiconductor light emitting element die-bonded to the substrate; and
a lens covering said at least one semiconductor light emitting element,
the lens including four planes uprising from the substrate and a lens having a ceiling surface facing the substrate,
the four planes being positioned in four directions, respectively, in such a manner as to surround said at least one semiconductor light emitting element,
the ceiling surface having a concave portion, and
emission of light from the light emitting device forming, on a view plane parallel to the substrate, a contour of an illumination shape which is a rectangle whose corners are rounded.

* * * * *